(12) United States Patent
Hur et al.

(10) Patent No.: US 7,259,421 B2
(45) Date of Patent: Aug. 21, 2007

(54) NON-VOLATILE MEMORY DEVICES HAVING TRENCHES

(75) Inventors: Sung-Hoi Hur, Seoul (KR); Jung-Dal Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 25 days.

(21) Appl. No.: 11/020,920

(22) Filed: Dec. 23, 2004

(65) Prior Publication Data

US 2006/0027855 A1    Feb. 9, 2006

(30) Foreign Application Priority Data

Aug. 3, 2004  (KR) ............... 10-2004-0061249

(51) Int. Cl.
*H01L 29/788* (2006.01)
(52) U.S. Cl. ............... 257/315; 257/316; 257/E21.551
(58) Field of Classification Search ............... 257/315, 257/316, E21.551
See application file for complete search history.

(56) References Cited

U.S. PATENT DOCUMENTS

| | | | |
|---|---|---|---|
| 5,807,778 A | 9/1998 | Lee | ............... 438/257 |
| 6,243,295 B1* | 6/2001 | Satoh | ............... 365/185.17 |
| 6,531,347 B1 | 3/2003 | Huster et al. | ............... 438/164 |
| 6,850,439 B1* | 2/2005 | Tanaka | ............... 365/185.17 |
| 2003/0094635 A1 | 5/2003 | Yaegashi | |
| 2003/0124803 A1* | 7/2003 | Ueda et al. | ............... 438/262 |

FOREIGN PATENT DOCUMENTS

| | | |
|---|---|---|
| JP | 2003-152116 | 5/2003 |
| KR | 000001034 | 1/2000 |

OTHER PUBLICATIONS

Office Action corresponding to German Patent Application No. 10-2005-030845.7-33 mailed on Oct. 17, 2006.

* cited by examiner

*Primary Examiner*—Andy N. Huynh
(74) *Attorney, Agent, or Firm*—Myers Bigel Sibley & Sajovec, PA

(57) ABSTRACT

A semiconductor memory device includes a semiconductor substrate having a trench therein. First and second gate patterns are formed on a surface of the substrate adjacent the trench, a respective one of which is on a respective opposing side of the trench. A split source/drain region is formed in the substrate between the first gate pattern and the second gate pattern such that the split source/drain region is divided by the trench. The split source/drain region includes a first source/drain subregion between the first gate pattern and the trench and a second source/drain subregion between the second gate pattern and the trench and spaced apart from the first source/drain subregion. A connecting region is formed in the substrate that extends around the trench from the first source/drain subregion to the second source/drain subregion. Related methods are also discussed.

31 Claims, 20 Drawing Sheets

NON-VOLATILE MEMORY DEVICES HAVING TRENCHES

CROSS-REFERENCE TO RELATED APPLICATION

This application claims priority under 35 U.S.C. §119 from Korean Patent Application No. 10-2004-0061249, filed Aug. 3, 2004, the contents of which are hereby incorporated by reference here in its entirety.

BACKGROUND OF THE INVENTION

1. Field of the Invention

The present invention relates to semiconductor devices, and, more particularly, to non-volatile memory devices and methods of forming the same.

2. Description of Related Art

NAND type non-volatile memory devices may be used in portable electronic products for a variety of functions. For example, NAND type non-volatile memory devices may be used to store image data in digital cameras and/or to store micro codes in portable telephones. NAND type non-volatile memory devices may include storage cell gate patterns and select gate patterns serially connected to at least one bit line pattern in an active region of a semiconductor substrate. The devices may be capable of performing data read and write operations to implement functions suitable for portable electronic products. The cell gate patterns may be located between the select gate patterns. The select gate patterns and the cell gate patterns may respectively correspond to select transistors and cell transistors.

However, the electrical properties of NAND type non-volatile memory devices may be degraded as the devices are scaled-down. This may be due to several factors. For example, NAND type non-volatile memory devices may include select gate patterns and storage cell gate patterns on the same active region, each of which may be driven by different voltages. When cell gate patterns for a specific bit line are programmed, the electrical properties of cell gate patterns for other bit lines adjacent to the specific bit line may be degraded. In particular, the cell and select gate patterns may see increased electric field intensity as distances therebetween are reduced. The increased electric field intensity may be accompanied by increased electrical coupling between the cell and select gate patterns. As such, hot electrons may be more easily injected into the gate insulating layer. As data read and write operations are repeatedly performed, the hot electrons injected into the gate insulating layer may speed up and/or slow down the data read and write operations, which may cause the NAND type non-volatile memory devices to malfunction. Thus, the electrical properties of the NAND type non-volatile memory devices may be rapidly degraded as the number of read and write operations increases.

Also, U.S. Pat. No. 5,807,778 to Lee discloses a method of manufacturing a shallow trench source EPROM cell. As noted in the Abstract of the Lee patent, the inventive cell comprises a source area which is at a lower plane than the drain region, and a program charge is transferred to the floating gate through the source-side injector. Instead of using a self-aligned high-energy n-type dopant implant at the source side to form the source side injector as used with previous cells, which can be difficult to control, etching the substrate before impurity doping allows for the controllable formation of a sharp point of doped silicon, and allows for improved programming at a lower voltage.

SUMMARY OF THE INVENTION

According to some embodiments of the present invention, a semiconductor memory device may include a semiconductor substrate including a trench therein and first and second gate patterns on a surface of the substrate adjacent the trench. A respective one of the first and second gate pattern may be on a respective opposing side of the trench. The device may further include a split source/drain region in the substrate between the first gate pattern and the second gate pattern and divided by the trench. The split source/drain region may include a first source/drain subregion between the first gate pattern and the trench and a second source/drain subregion between the second gate pattern and the trench. The device may also include a connecting region in the substrate that extends around the trench from the first source/drain subregion to the second source/drain subregion.

In some embodiments, the connecting region and the split source/drain region may be a same conductivity type. The connecting region may have a higher carrier concentration than that of the split source/drain region.

In other embodiments, the trench may include opposing sidewalls and a lower surface remote from the surface of the substrate. A respective first and second source/drain subregion may be adjacent a respective sidewall at the substrate surface, and the connecting region may extend from the first and second source/drain subregions along the sidewalls and around the lower surface. The sidewalls of the trench may be oblique relative to the substrate surface.

In some embodiments, the semiconductor device may further include spacers on sidewalls of the first and second gate patterns. The spacers may face one another and may be aligned with the trench. The device may further include an insulating layer between the first and second gate patterns that fills the trench.

In other embodiments, each of the first and second gate patterns may include a gate insulating layer pattern, a floating gate pattern, and a control gate pattern.

In some embodiments, the connecting region and the split source/drain region may be n-type regions.

In other embodiments, the semiconductor device may be a NAND type flash memory device. The first gate pattern may be a select gate pattern, and the second gate pattern may be a storage gate pattern.

According to some embodiments of the present invention, a NAND type non-volatile semiconductor memory device may include first and second select gate patterns on a surface of a semiconductor substrate and a plurality of storage gate patterns on the surface of the substrate between the first and second select gate patterns. The substrate may include a first trench therein between the first select gate pattern and a first one of the plurality of storage gate patterns that is adjacent thereto. The substrate may further include a second trench therein between the second select gate pattern and a second one of the plurality of storage gate patterns that is adjacent thereto.

In some embodiments, the device may include a first split source/drain region in the substrate between the first select gate pattern and the first one of the plurality of storage gate patterns and split by the first trench. The device may further include a second split source/drain region in the substrate between the second select gate pattern and the second one of the plurality of storage gate patterns and split by the second trench.

In other embodiments, the first split source/drain region may include a first source/drain subregion between the first select gate pattern and the first trench and a second source/ drain subregion between the first trench and the first one of the plurality of storage gate patterns and spaced apart from the first source/drain subregion. The second split source/drain region may include a third source/drain subregion between the second select gate pattern and the second trench and a fourth source/drain subregion between the second trench and the second one of the plurality of storage gate patterns and spaced apart from the third source/drain subregion.

In some embodiments, the device may include a first connecting region in the substrate that extends around the first trench from the first source/drain subregion to the second source/drain subregion. The device may further include a second connecting region in the substrate that extends around the second trench from the third source/drain subregion to the fourth source/drain subregion.

In other embodiments, the first and second connecting regions and the first and second split source/drain regions may be a same conductivity type. The first and second connecting regions may have higher carrier concentrations than carrier concentrations of the first and second split source/drain regions.

In some embodiments, the first and second trenches may respectively include opposing sidewalls and a lower surface remote from the surface of the substrate. A respective first and second source/drain subregion may be adjacent a respective sidewall of the first trench. A respective third and fourth source/drain subregion may be adjacent a respective sidewall of the second trench. The first and second connecting regions may respectively extend along the sidewalls and around the lower surface of the respective first and second trenches.

In other embodiments, a distance between storage gate patterns may be less than a distance between the first select gate pattern and the first one of the plurality of storage gate patterns that is adjacent thereto.

According to some embodiments of the present invention, a method of forming a semiconductor device on a semiconductor substrate may include forming first and second gate patterns on a surface of the substrate, and forming a split source/drain region and a trench therebetween in the substrate between the first gate pattern and the second gate pattern. The split source/drain region may include spaced apart first and second source/drain subregions. The method may further include forming a connecting region in the substrate that extends around the trench from the first source/drain subregion to the second source/drain subregion.

In some embodiments, the connecting region and the split source/drain region may be formed to have a same conductivity type. Forming a connecting region may include forming a connecting region having a higher carrier concentration than a carrier concentration of the split source/drain region.

In other embodiments, the trench may include opposing sidewalls and a lower surface remote from the surface of the substrate. Forming the split source/drain region may include forming a respective first and second source/drain subregion adjacent a respective sidewall at the substrate surface. Forming the connecting region may include forming the connecting region to extend from the first and second source/drain subregions along the sidewalls and around the lower surface. The sidewalls of the trench may be formed oblique relative to the substrate surface.

In some embodiments, forming a trench may be preceded by forming spacers on sidewalls of the first and second gate patterns. Forming the trench may include forming the trench to be aligned with the spacers. The method may further include forming an insulating layer between the first and second gate patterns that fills the trench.

In other embodiments, the connecting region and the split source/drain region may be n-type regions. In some embodiments, the semiconductor device may be a NAND type flash memory device. Forming the first gate pattern may include forming a select gate pattern, and forming the second gate pattern may include forming a storage gate pattern.

In some embodiments, forming a split source/drain region and a trench therebetween may include forming a single source/drain region between the first and second gate patterns, and forming the trench in the single source drain/region to split the single source/drain region into the first and second spaced apart source/drain subregions.

According to some embodiments of the present invention, a method of forming a NAND type non-volatile semiconductor memory device may include forming first and second select gate patterns on a surface of a semiconductor substrate and a plurality of storage gate patterns on the surface of the substrate between the first and second select gate patterns. The method may further include forming a first trench in the substrate between the first select gate pattern and a first one of the plurality of storage gate patterns that is adjacent thereto, and forming a second trench in the substrate between the second select gate pattern and a second one of the plurality of storage gate patterns that is adjacent thereto.

In some embodiments, forming a first trench and forming a second trench are preceded by forming a first source/drain region in the substrate between the first select gate pattern and the first one of the plurality of storage gate patterns, and forming a second source/drain region in the substrate between the second select gate pattern and the second one of the plurality of storage gate patterns and separated by the second trench. Forming the first trench may divide the first source drain region into a first split source/drain region having first and second spaced apart source/drain subregions, and forming the second trench may divide the second source/drain region into a second split source/drain region having third and fourth spaced apart source/drain subregions.

In other embodiments, the first source/drain subregion may be formed between the first select gate pattern and the first trench, and the second source/drain subregion may be formed between the first trench and the first one of the plurality of storage gate patterns. The third source/drain subregion may be formed between the second select gate pattern and the second trench, and the fourth source/drain subregion may be formed between the second trench and the second one of the plurality of storage gate patterns.

In some embodiments, the method may further include forming a first connecting region in the substrate that extends around the first trench from the first source/drain subregion to the second source/drain subregion. The method may also include forming a second connecting region in the substrate that extends around the second trench from the third source/drain subregion to the fourth source/drain subregion.

In other embodiments, the first and second connecting regions and the first and second split source/drain regions may be formed to be a same conductivity type. In some embodiments, forming the first and second connecting regions may include forming first and second connecting regions having higher carrier concentrations than carrier concentrations of the first and second split source/drain regions.

In some embodiments, the first and second trenches may respectively include opposing sidewalls and a lower surface remote from the surface of the substrate. A respective first and second source/drain subregion may be formed adjacent a respective sidewall of the first trench. A respective third and fourth source/drain subregion may be formed adjacent a respective sidewall of the second trench. The first and second connecting regions may be formed to respectively extend along the sidewalls and around the lower surface of the respective first and second trenches.

In other embodiments, forming the first select gate pattern may include forming the first select gate pattern on the substrate at a distance from the first one of the plurality of storage gate patterns that is greater than a distance between storage gate patterns.

According to some embodiments of the present invention, a non-volatile memory device may include a plurality of cell gate patterns spaced apart from each other on an active region of a semiconductor substrate. The device may also include first and second select gate patterns adjacent to first and second cell gate patterns on outermost sides of the plurality of cell gate patterns on the semiconductor substrate. The first select gate pattern may be placed opposite to the second cell gate pattern and in parallel with the first cell gate pattern. The second select gate pattern may be placed opposite to the first cell gate pattern and in parallel with the second cell gate pattern. The surfaces of the semiconductor substrate beneath the first and second cell gate patterns may have step differences with surfaces of the semiconductor substrate between the first cell gate pattern and the first select gate pattern and between the second cell gate pattern and the second select gate pattern.

In some embodiments, a non-volatile memory device may include an active region of a semiconductor substrate having first and second regions. A cell gate pattern and a select gate pattern may be formed on the first and second regions, respectively. A gate insulating layer may be interposed between the select gate pattern and the first region and between the cell gate pattern and the second region. An impurity diffusion layer may be formed in the semiconductor substrate under the gate insulating layer. The impurity diffusion layer may overlap with the cell gate pattern. A space trench may be formed in the semiconductor substrate between the first and second regions. The first and second regions may be coplanar.

In other embodiments, a non-volatile memory device may include two recess regions formed in an active region of a semiconductor substrate and spaced at a predetermined interval along a longitudinal direction of the active region. Each of the recess regions may include left and right sidewalls that face each other. At least two cell gate patterns may be formed on the active region of the semiconductor substrate between the right sidewall of a first one of the recess regions and the left sidewall of a second one of the recess regions. First and second select gate patterns may be formed on the active region of the semiconductor substrate. The first select gate pattern may be adjacent to the left sidewall of the first one of the recess regions, and the second select gate pattern may be adjacent to the right sidewall of the second one of the recess regions.

In some embodiments, a method of forming a non-volatile memory device may include forming an active region on a semiconductor substrate. First and second select gate patterns and a plurality of cell gate patterns may be formed on the active region of the semiconductor substrate. The cell gate patterns may be formed between the first and second select gate patterns and may be formed to include first and second cell gate patterns on outermost sides thereof. First impurity diffusion layers may be formed in the semiconductor substrate using the first and second select gate patterns and the cell gate patterns as an ion mask. Space trenches may be formed in the semiconductor substrate between the first cell gate pattern and the first select gate pattern and between the second cell gate pattern and the second select gate pattern.

DETAILED DESCRIPTION OF EMBODIMENTS OF THE INVENTION

Figure 1:
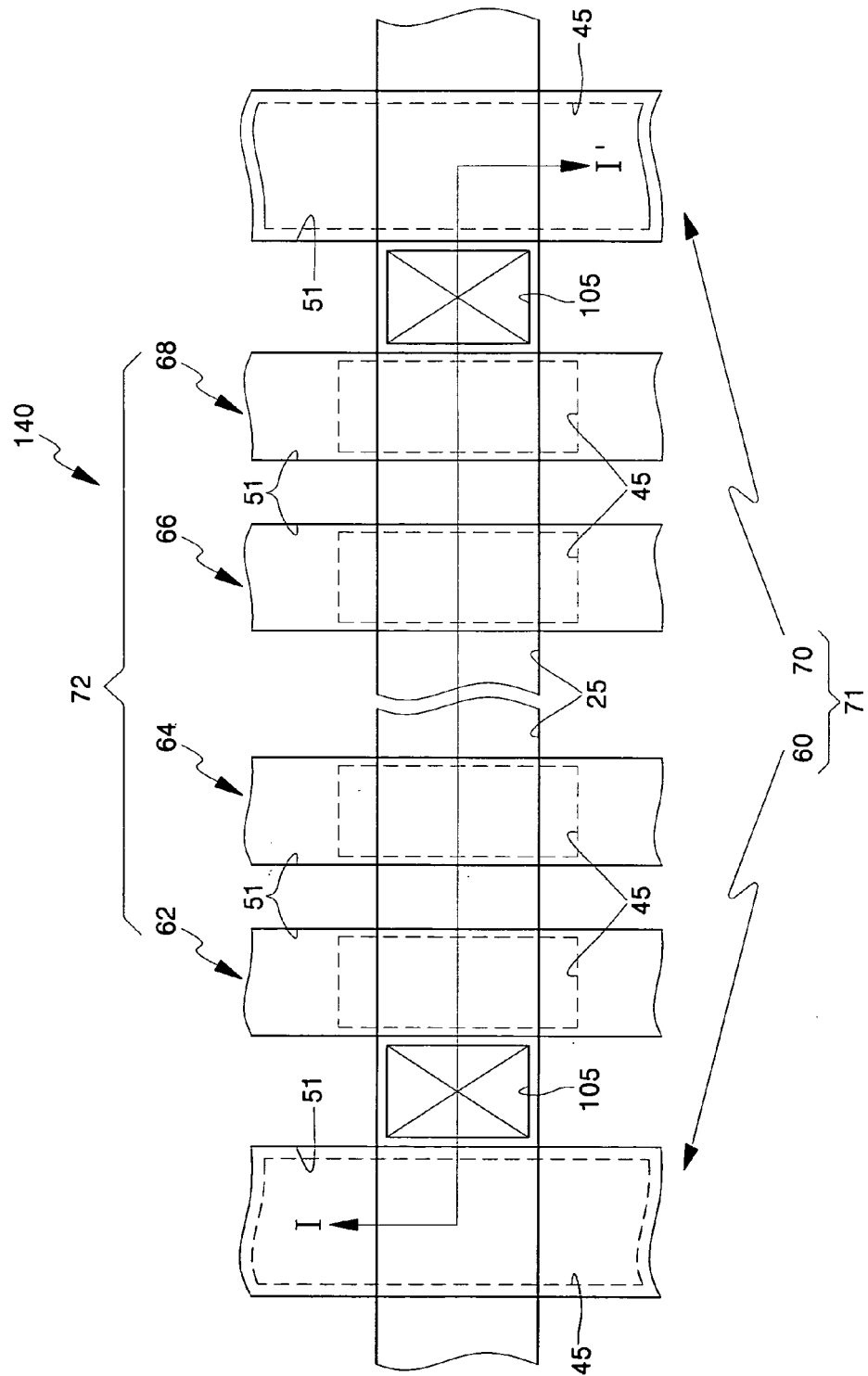
FIG. 1 is a plan view of a non-volatile memory device according to some embodiments of the present invention.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 2:
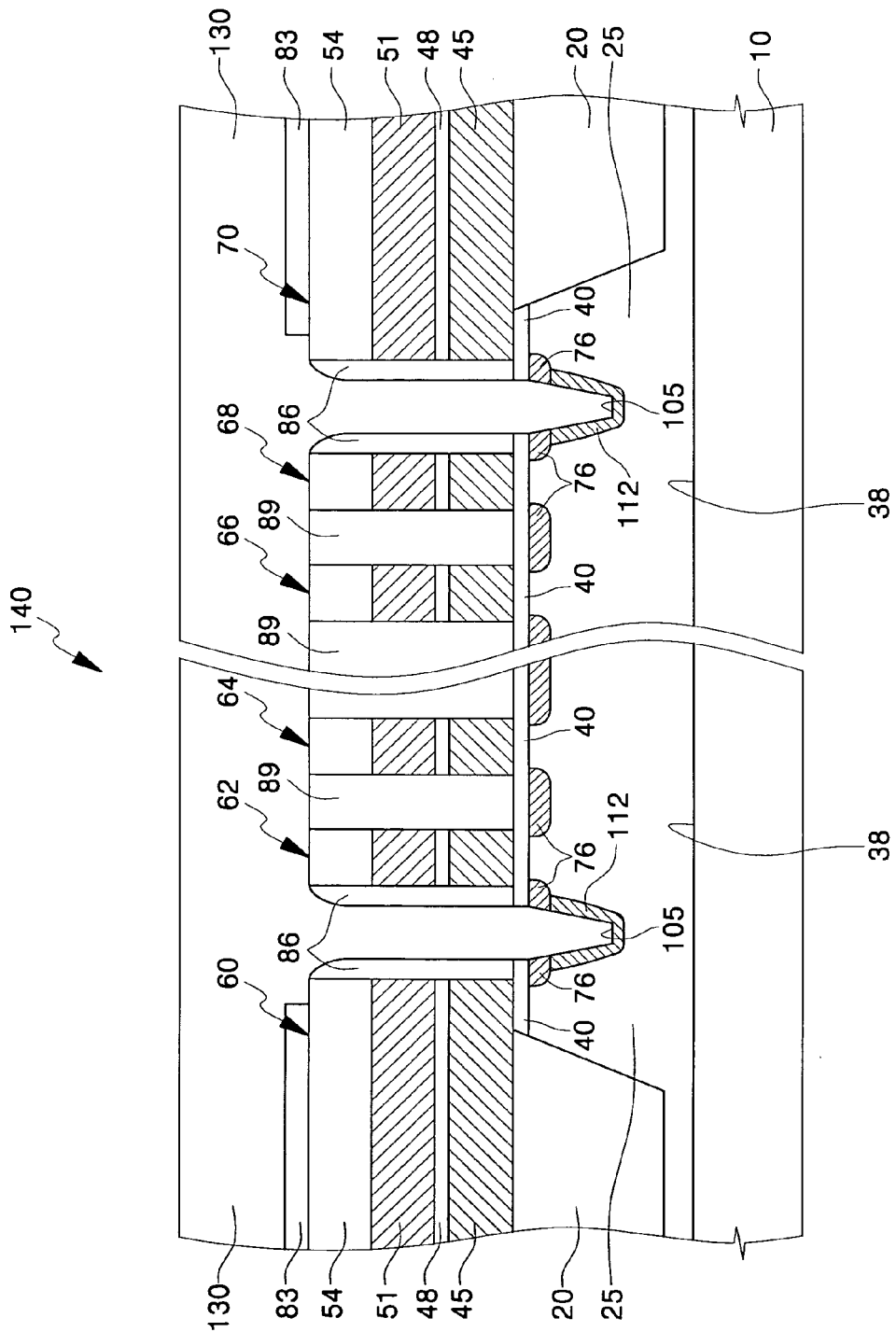
FIG. 2 is a cross-sectional view of a non-volatile memory device according to some embodiments of the present invention taken along line I–I' of FIG. 1.
Figure 3:
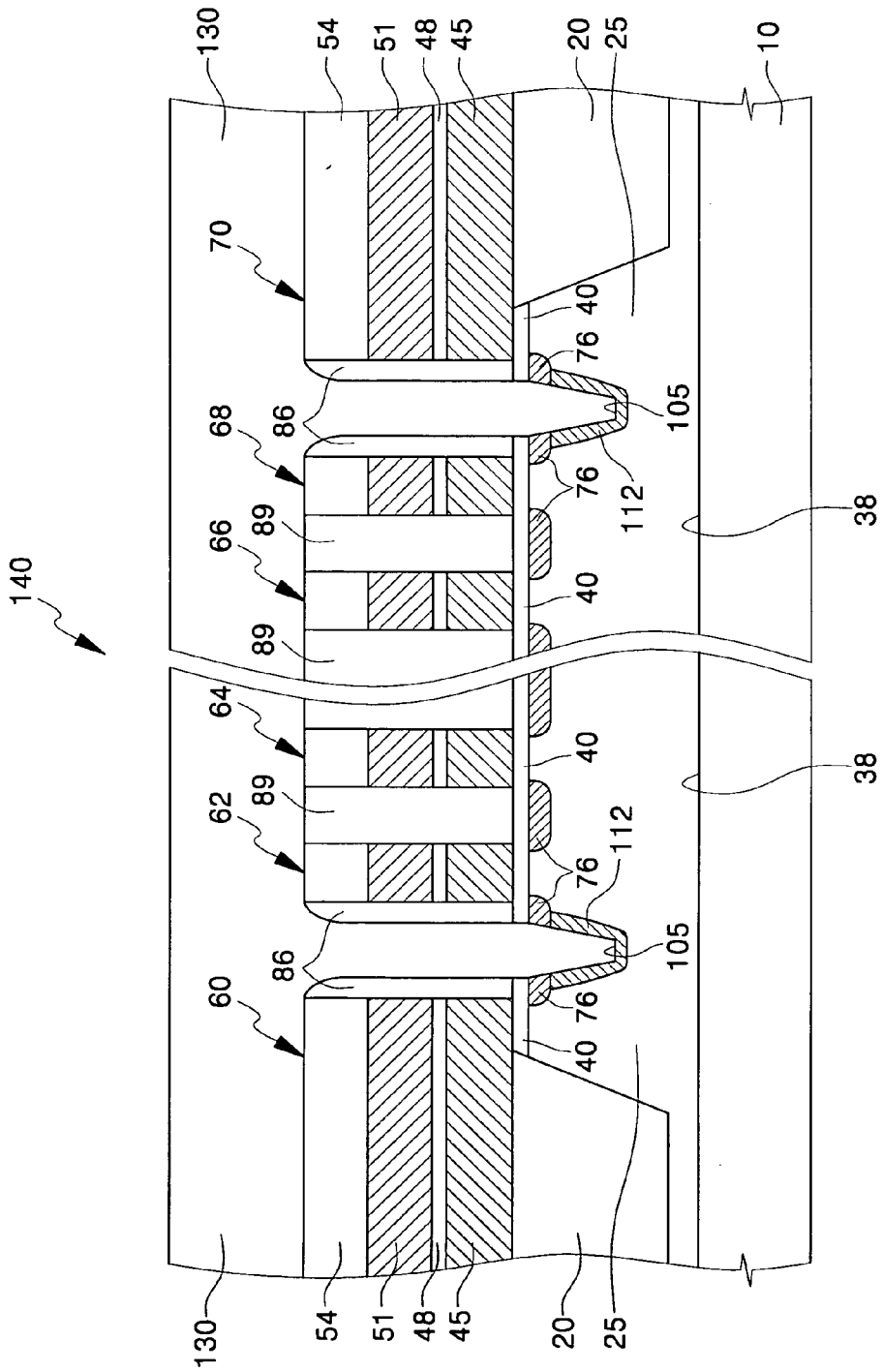
FIG. 3 is a cross-sectional view of a non-volatile memory device according to some embodiments of the present invention taken along line I–I' of FIG. 1.
Figure 4:
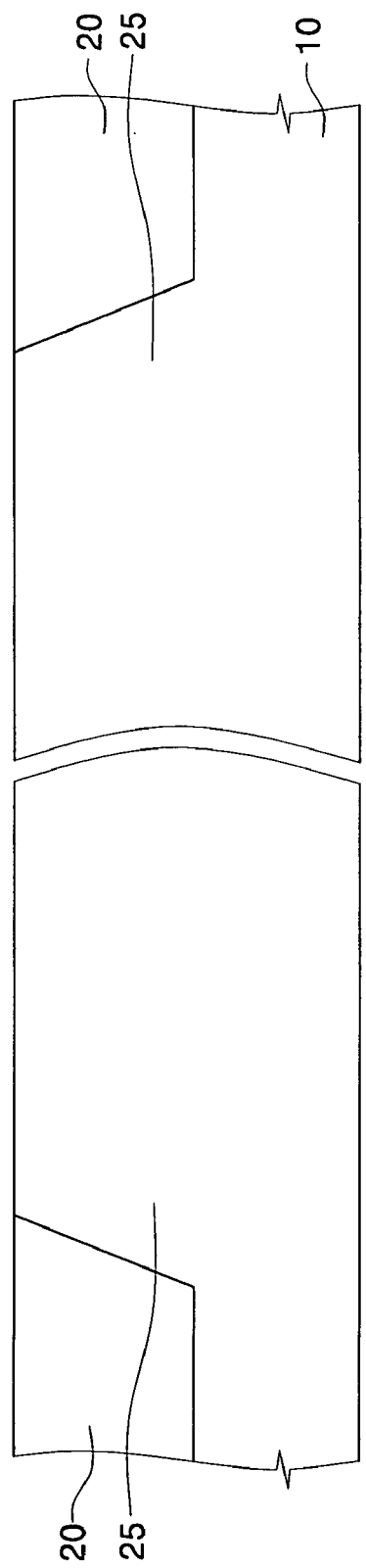
FIGS. 4 to 14 are cross-sectional views illustrating methods of forming a non-volatile memory device according to some embodiments of the present invention taken along line I–I' of FIG. 1.

Semiconductor devices according to some embodiments of the present invention will now be described with reference to FIGS. 1 to 3. FIG. 1 is a plan view of a non-volatile memory device according to some embodiments of the present invention. FIGS. 2 and 3 are cross-sectional views of a non-volatile memory device according to some embodiments of the present invention taken along line I–I' of FIG. 1.

Referring to FIGS. 1 and 2, in a non-volatile memory device 140, at least four storage cell gate patterns, such as first to fourth cell gate patterns 62, 64, 66, and 68, are formed on an active region 25 of a semiconductor substrate 10. The active region 25 is defined by a device insulating layer 20 on the semiconductor substrate 10. The active region 25 has a length and a width. The first to fourth cell gate patterns 62, 64, 66, and 68 are arranged in parallel in a longitudinal direction on the active region 25 and are spaced at equal intervals. First and second select gate patterns 60 and 70 are formed adjacent the first to fourth cell gate patterns 62, 64, 66, and 68 on the semiconductor substrate 10. More particularly, the first select gate pattern 60 is formed opposite to the fourth cell gate pattern 68 and is adjacent and in parallel with the first cell gate pattern 62. The second select gate pattern 70 is formed opposite to the first cell gate pattern 62 and is adjacent and in parallel with the fourth cell gate pattern 68. Each of the first and second select gate patterns 60 and 70 and the first to fourth cell gate patterns 62, 64, 66, and 68 may include a floating gate pattern 45, a dielectric layer pattern 48, a control gate pattern 51, and a gate capping layer pattern 54, which are sequentially stacked.

As shown in FIG. 1, the floating gate patterns 45 of the first and second select gate patterns 60 and 70 may have different shapes than the floating gate patterns 45 of the first to fourth storage cell gate patterns 62, 64, 66, and 68. The first and second select gate patterns 60 and 70 may also have different sizes than the first to fourth cell gate patterns 62, 64, 66, and 68. In some embodiments, the dielectric layer pattern 48 may include a silicon oxide ($SiO_2$) layer, a silicon nitride ($Si_3N_4$) layer, and a silicon oxide ($SiO_2$) layer that are sequentially stacked. The dielectric layer pattern 48 may have a silicon oxide ($SiO_2$) layer and a silicon nitride ($Si_3N_4$) layer stacked thereon. The control gate layer pattern 51 and the floating gate layer pattern 45 may be N-type doped polysilicon layers. The semiconductor substrate 10 may include P-type impurity ions. The non-volatile memory device 140 may be a NAND type flash memory device.

Referring now to FIG. 2, spacer isolation patterns 89 are formed on the active region 25 of the semiconductor substrate 10. The spacer isolation patterns 89 fill regions between the first to fourth cell gate patterns 62, 64, 66, and 68. Spacer sidewall patterns 86 cover sidewalls of the first cell gate pattern 62 and the first select gate pattern 60, and also cover sidewalls of fourth cell gate pattern 68 and the second select gate pattern 70. Spacer layer patterns 83 cover other sidewalls and top surfaces of the first and second select gate patterns 60 and 70.

The space trenches 105 are respectively formed in the active region 25 of the substrate 10 between the first cell gate pattern 62 and the first select gate pattern 60, and between the fourth cell gate pattern 68 and the second select gate pattern 70. Each of the space trenches 105 has opposing sidewalls and a lower or bottom surface. The bottom surface of each of the space trenches 105 has a step difference as compared with the surface of the semiconductor substrate 10. In some embodiments, the space trenches 105 may have sidewalls that are inclined at an angle that is different than the angle between the spacer sidewall patterns 86 and the surface of the semiconductor substrate 10. The space trenches 105 are aligned with the spacer sidewall patterns 86. The distance between the first cell gate pattern 62 and the first select gate pattern 60 and between the fourth cell gate pattern 68 and the second select gate pattern 70 may be greater than the distance between each of the first to fourth cell gate patterns 62, 64, 66, and 68. Upper widths of the space trenches 105 may be smaller than the distance between the first cell gate pattern 62 and the first select gate pattern 60 and/or the distance between the fourth cell gate pattern 68 and the second select gate pattern 70.

A gate insulating layer 40 is formed on the surface of the substrate 10 beneath the first to fourth cell gate patterns 62, 64, 66, and 68, and the select gate patterns 60 and 70. The gate insulating layer 40 may be formed to a different thickness under the select gate patterns 60 and 70 than under the first to fourth cell gate patterns 62, 64, 66, and 68. Each of the space trenches 105 may penetrate the gate insulating layer 40 and may extend into the semiconductor substrate 10 to a depth that is greater than the thickness of each of the spacer sidewall patterns 86. A well region 38 may also be formed in the semiconductor substrate 10. The well region 38 may have the same conductivity type as the semiconductor substrate 10.

Lower concentration impurity diffusion layers 76 are formed between the select gate patterns 60 and 70 and the storage cell gate patterns 62, 64, 66, and 68 in the semiconductor substrate 10. The lower concentration impurity diffusion layers 76 overlap the first to fourth cell gate patterns 62, 64, 66, and 68. The lower concentration impurity diffusion layers 76 also overlap with the first and second select gate patterns 60 and 70. The lower concentration impurity diffusion layers 76 may correspond to source/drain regions. Higher concentration impurity diffusion layers 112 are formed in the semiconductor substrate 10 along the sidewalls and the bottom surface of the space trenches 105 beneath the lower concentration impurity diffusion layers 76. The lower and higher concentration impurity diffusion layers 76 and 112 may have the same conductivity type. In addition, the lower and higher concentration impurity diffusion layers 76 and 112 may have a conductivity type that is different than that of the semiconductor substrate 10. For example, the lower and higher concentration impurity diffusion layers 76 and 112 may be N-type layers, and the substrate 10 may be a P-type substrate. Further, the higher concentration impurity diffusion layers 112 need not be adjacent the trench sidewalls and/or the lower surface, but may be spaced apart therefrom. As such, the lower concentration impurity diffusion layers 76 between the first cell gate pattern 62 and the first select gate pattern 60 and between the fourth cell gate pattern 68 and the second select gate pattern 70 are divided by the space trenches 105 to form split source/drain regions. The split source/drain regions may thereby include spaced apart source/drain subregions on either side of each trench 105 adjacent upper portions of the sidewalls of each trench 105.

Still referring to FIG. 2, a planarization interlayer insulating layer 130 fills the space trenches 105 between the first cell gate pattern 62 and the first select gate pattern 60 and between the fourth cell gate pattern 68 and the second select gate pattern 70. The planarization interlayer insulating layer 130 also covers the spacer layer patterns 83.

Referring now to FIG. 3, alternate embodiments of the present invention are illustrated that include substantially the same components as shown in the embodiments of FIG. 2. However, as shown in FIG. 3, the spacer sidewall patterns 86 are also formed on other sidewalls of the first and second select gate patterns 60 and 70. In addition, the spacer patterns 83 of FIG. 2 are not included in the embodiments illustrated in FIG. 3.

Methods of forming non-volatile memory devices according to some embodiments of the present invention will now be described with reference to FIGS. 4 to 14.

Figure 15:
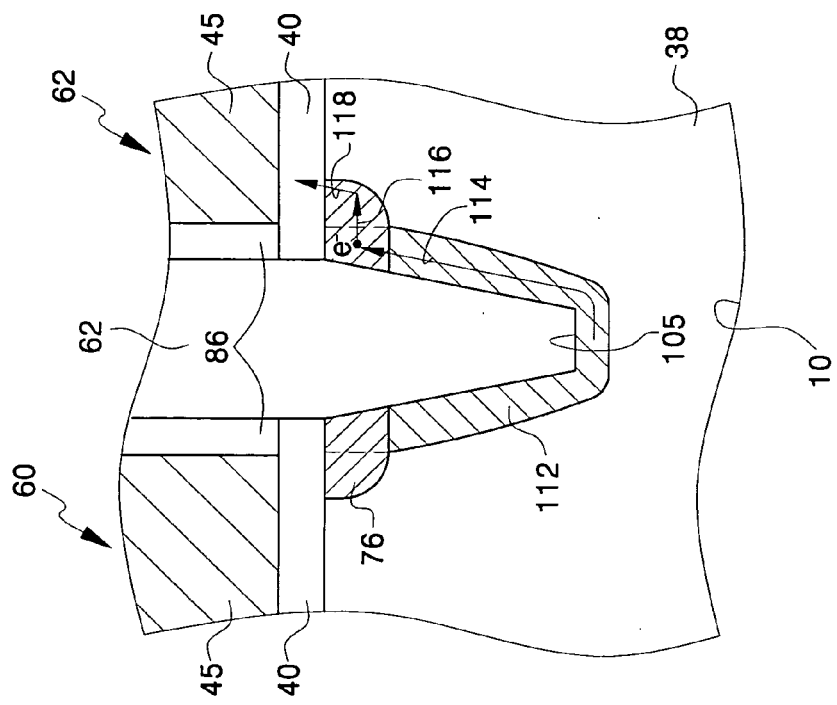
FIG. 15 is an enlarged cross-sectional view of a region A of FIG. 14.
Figure 16:
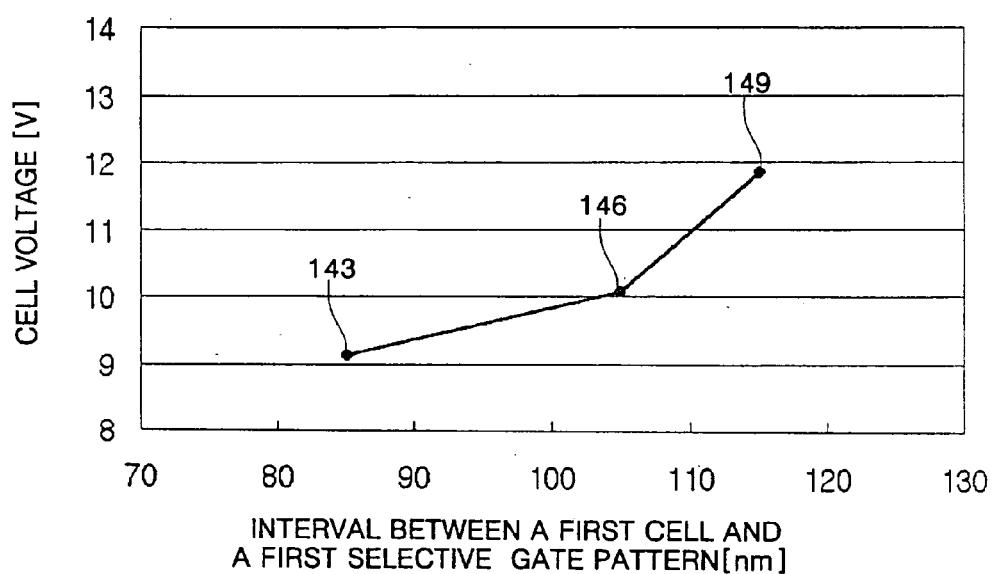
FIG. 16 is a graph illustrating electrical properties of the non-volatile memory device of FIG. 14.

FIGS. 4 to 14 are cross-sectional views illustrating methods of forming non-volatile memory devices taken along line I–I' of FIG. 1. FIG. 15 is an enlarged cross-sectional view of a region A of FIG. 14. FIG. 16 is a graph illustrating electrical properties of the non-volatile memory device of FIG. 14.

Referring now to FIGS. 1 and 4 to 7, a device insulating layer 20 is formed in a semiconductor substrate 10. The device insulating layer 20 is formed to isolate an active region 25 of the substrate 10 having a predetermined length and a predetermined width. The device insulating layer 20 may be formed to isolate one or more active regions 25. The device insulating layer 20 may be formed of a silicon oxide ($SiO_2$) layer. The semiconductor substrate 10 may be formed to have P-type impurity ions. A gate insulating layer 40 is formed on the active region 25 of the semiconductor substrate 10. The gate insulating layer 40 may be formed of a thermal oxide layer.

Figure 5:
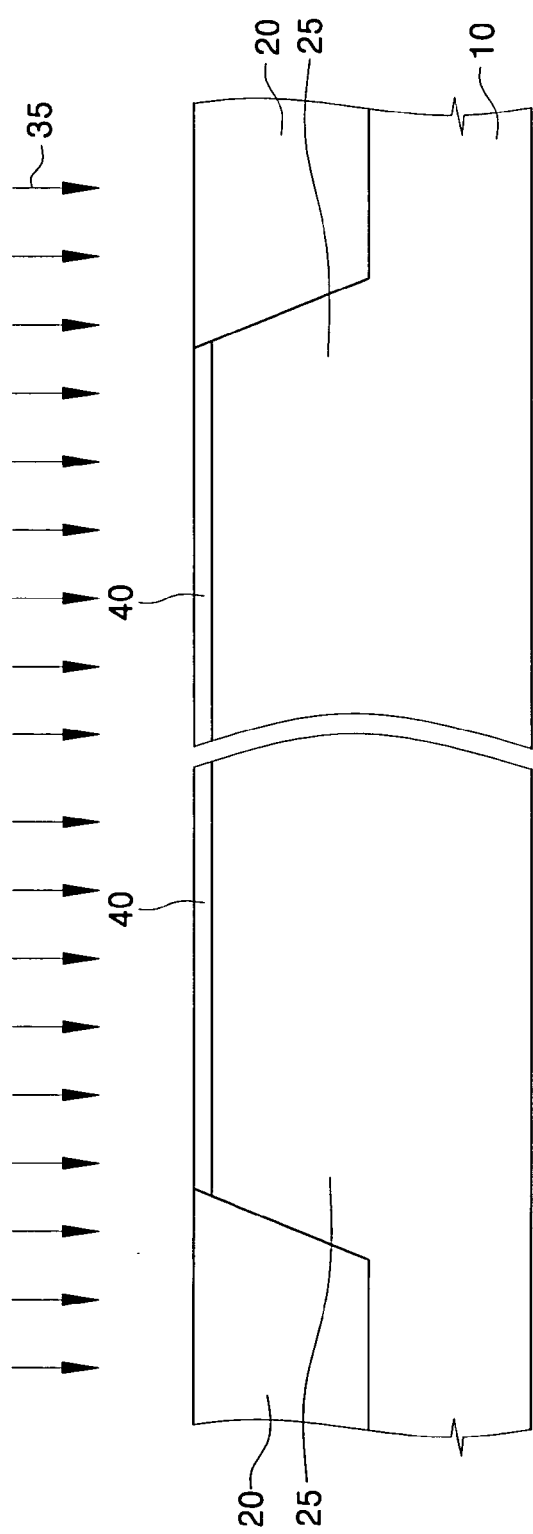
Figure 6:
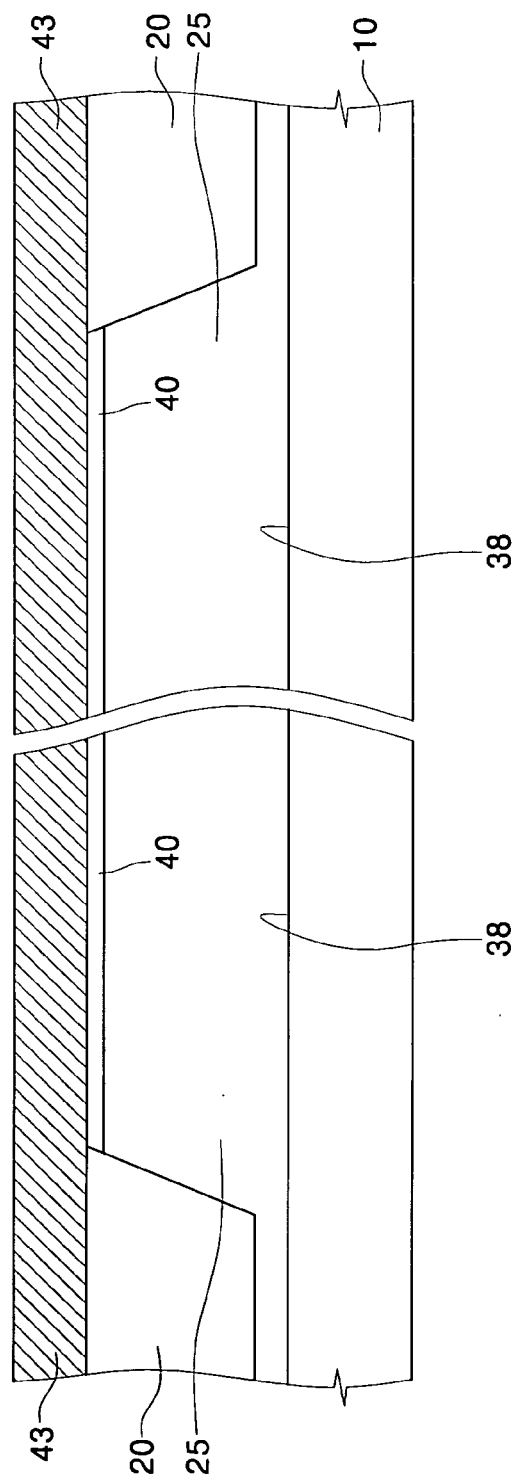

As shown in FIG. 5, an ion implantation process 35 is performed on the semiconductor substrate 10 using the device insulating layer 20 as an ion mask. The ion implantation process 35 forms a well region 38 in the semiconductor substrate 10, as illustrated in FIG. 6.

Figure 7:
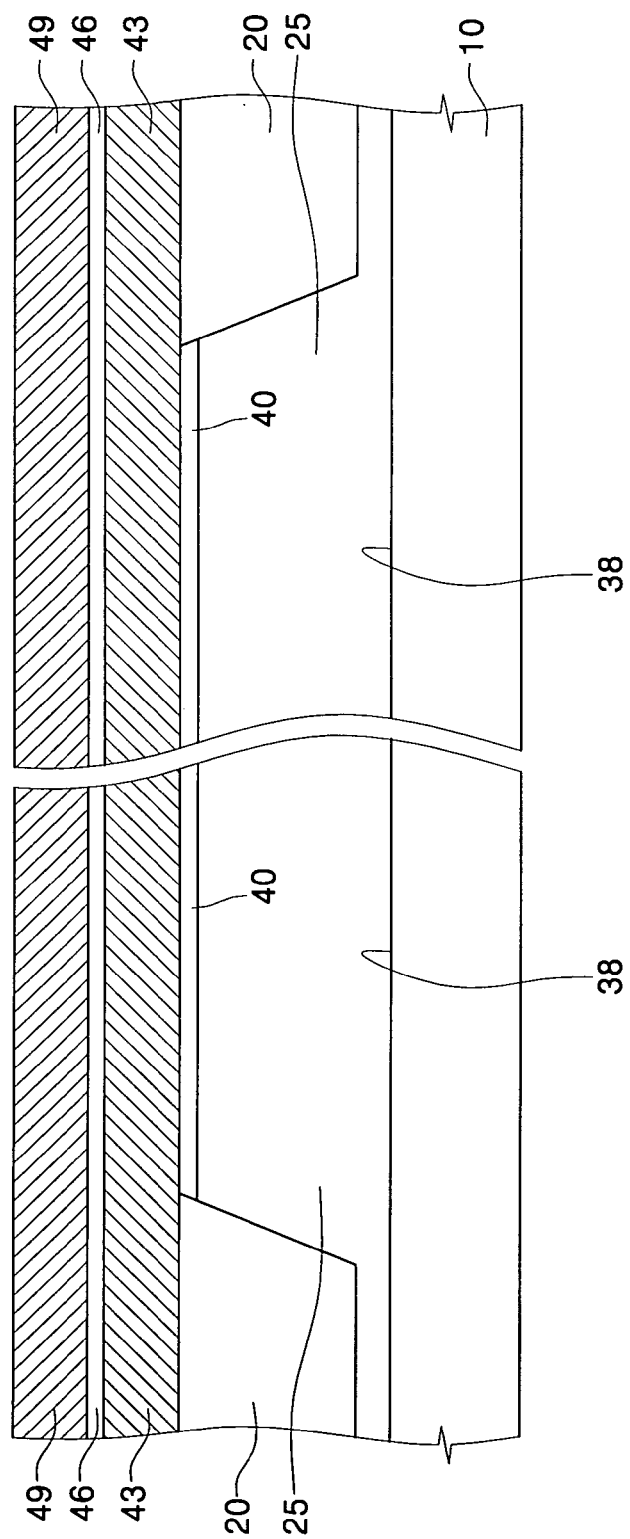

A floating gate layer 43, a dielectric layer 46, and a control gate layer 49 are formed on the gate insulating layer 40 and the device insulating layer 20, as shown in FIG. 7. The control gate layer 49 and the floating gate layer 43 may be formed of N-type doped polysilicon layers. The dielectric layer 46 may be formed of a silicon oxide layer, a silicon nitride ($Si_3N_4$) layer, and a silicon oxide layer, which are sequentially stacked. Alternatively, the dielectric layer 46 may be formed of a silicon oxide layer and a silicon nitride layer stacked thereon.

Figure 8:
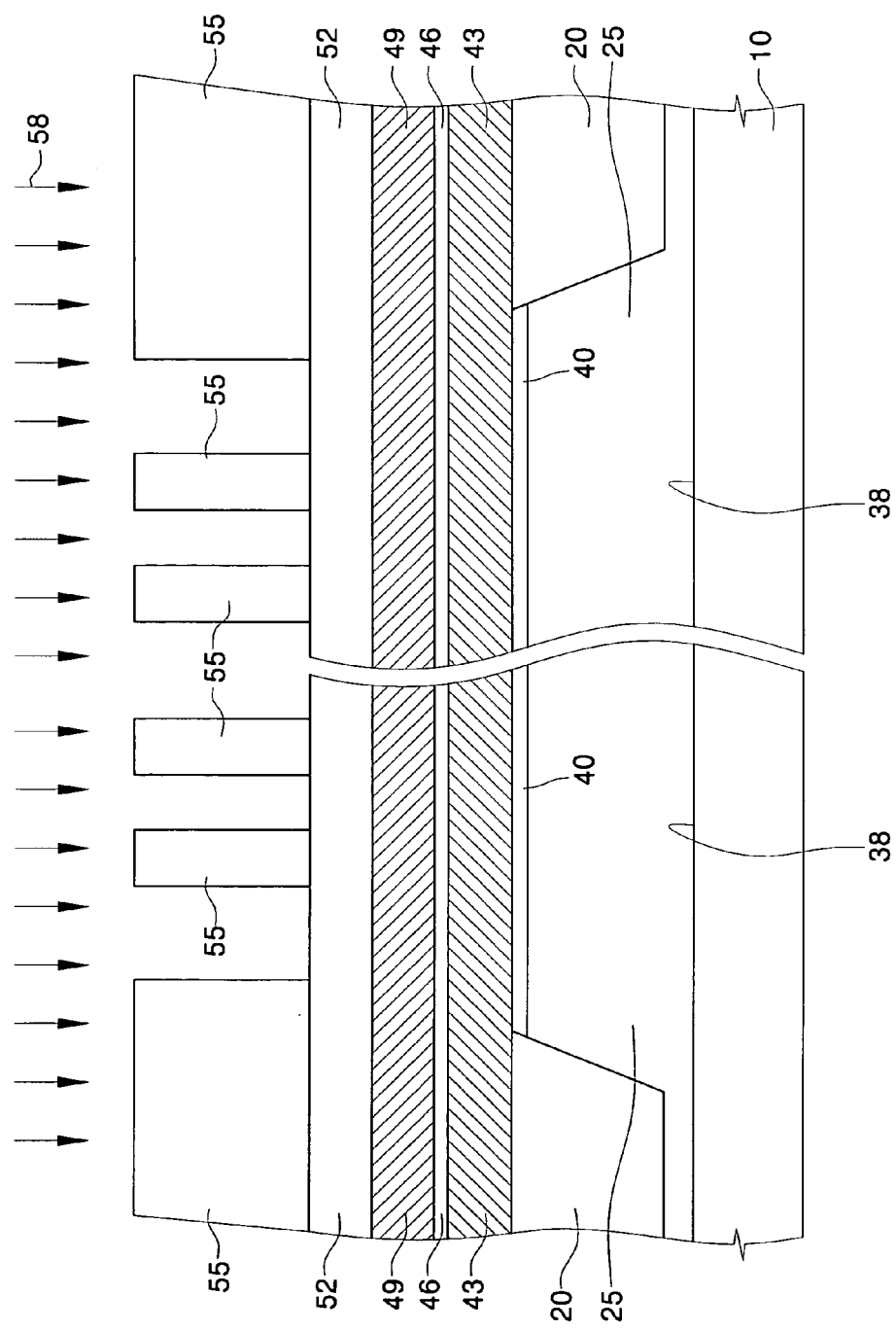
Figure 9:
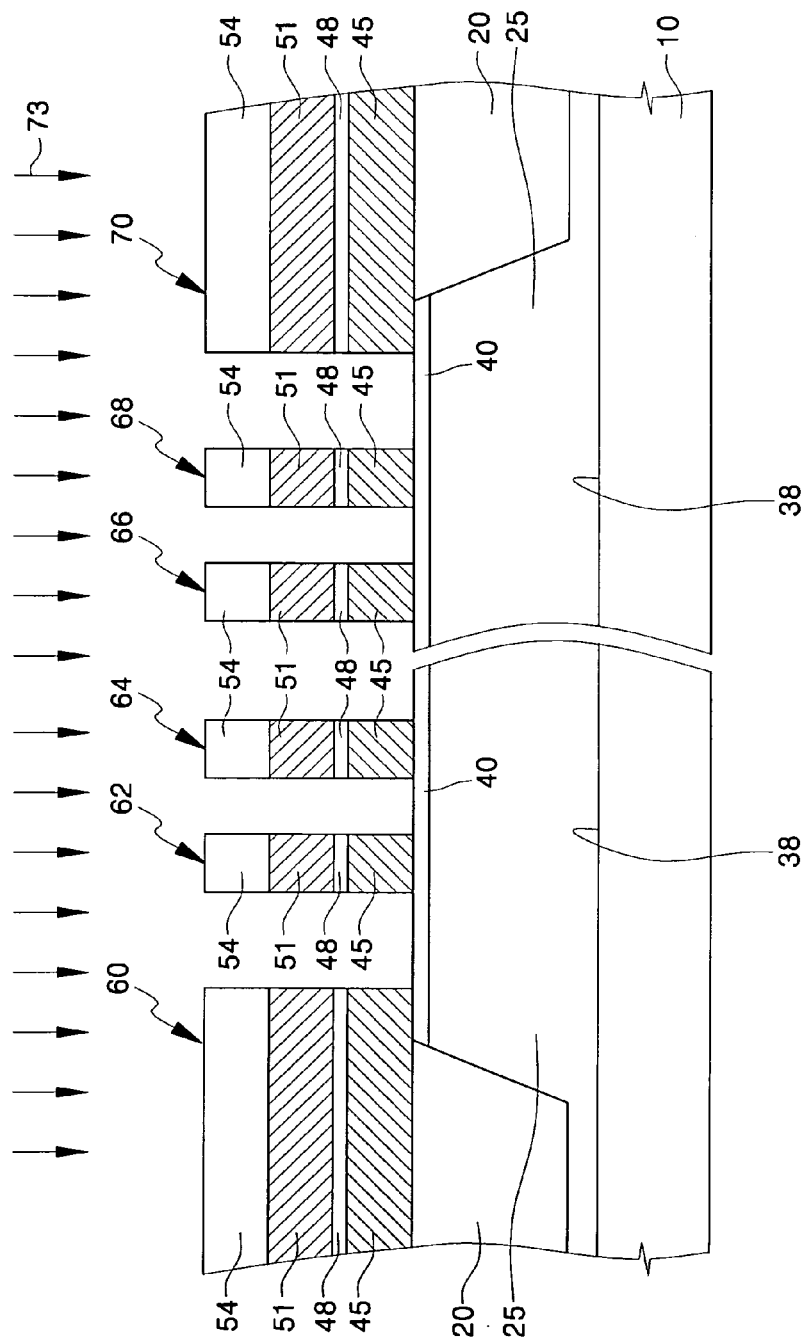

Referring now to FIGS. 1, 8 and 9, a gate capping layer 52 is formed on the control gate layer 49. Photoresist patterns 55 are formed on the gate capping layer 52. An etching process 58 is then performed on the gate capping layer 52, the control gate layer 49, the dielectric layer 46 and the floating gate layer 43 using the photoresist patterns 55 as an etching mask, as shown in FIG. 8.

As illustrated in FIG. 9, the etching process 58 forms first and second select gate patterns 60 and 70 and first to fourth storage cell gate patterns 62, 64, 66, and 68 between the select gate patterns 60 and 70 on the semiconductor substrate 10. The first to fourth cell gate patterns 62, 64, 66, and 68 may be formed to have the same distance therebetween. The distance between the first cell gate pattern 62 and the first select gate pattern 60, and the distance between the fourth cell gate pattern 68 and the second select gate pattern and 70, may be greater than the distance between each of the first to fourth cell gate patterns 62, 64, 66, and 68. Each of the first to fourth cell gate patterns 62, 64, 66, and 68 and the first and second select gate patterns 60 and 70 may be formed of a floating gate pattern 45, a dielectric layer pattern 48, a control gate pattern 51 and a gate capping layer pattern 54, which are sequentially stacked. The first and second select gate patterns 60 and 70 may be formed to different sizes than the first to fourth cell gate patterns 62, 64, 66, and 68. Further, the portion of gate insulating layer 40 beneath the first and second select gate patterns 60 and 70 may be formed to a different thickness than the portion of the gate insulating layer 40 beneath the first to fourth cell gate patterns 62, 64, 66, and 68.

An ion implantation process 73 is then performed on the semiconductor substrate 10 using the first to fourth cell gate patterns 62, 64, 66, and 68, and the first and second select gate patterns 60 and 70 as an ion mask.

Figure 10:
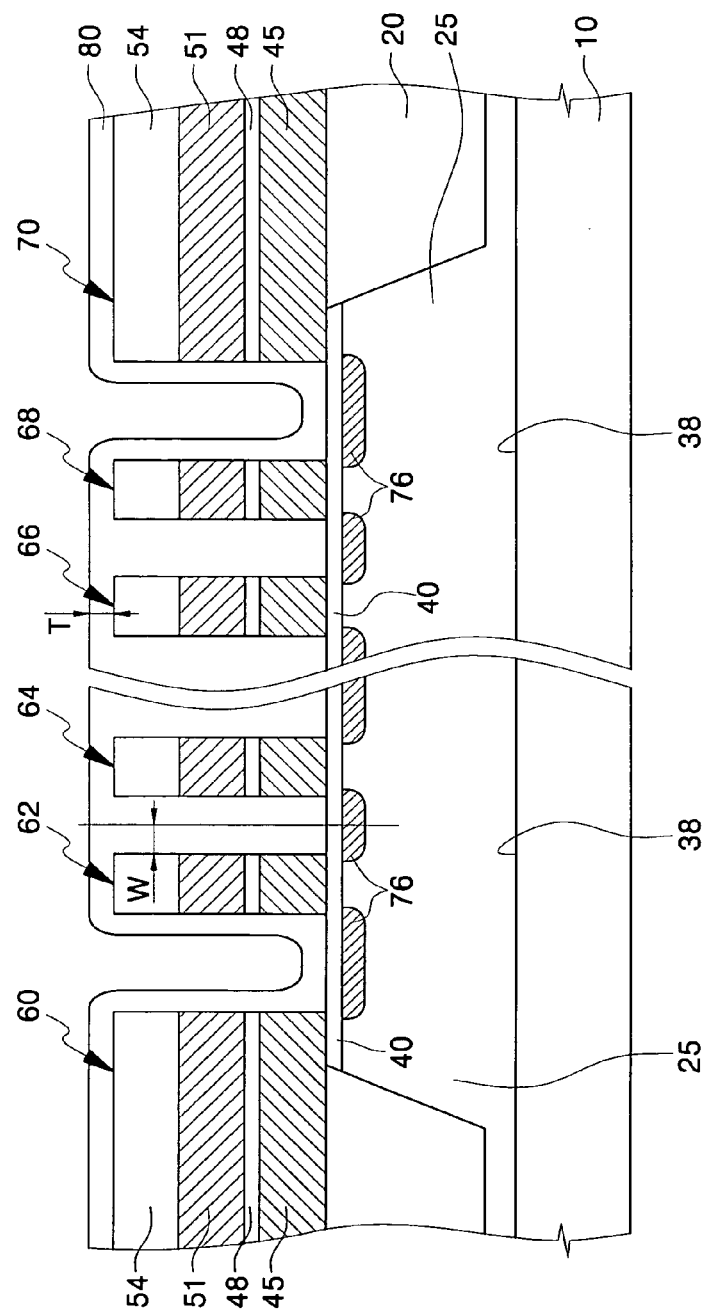
Figure 11:
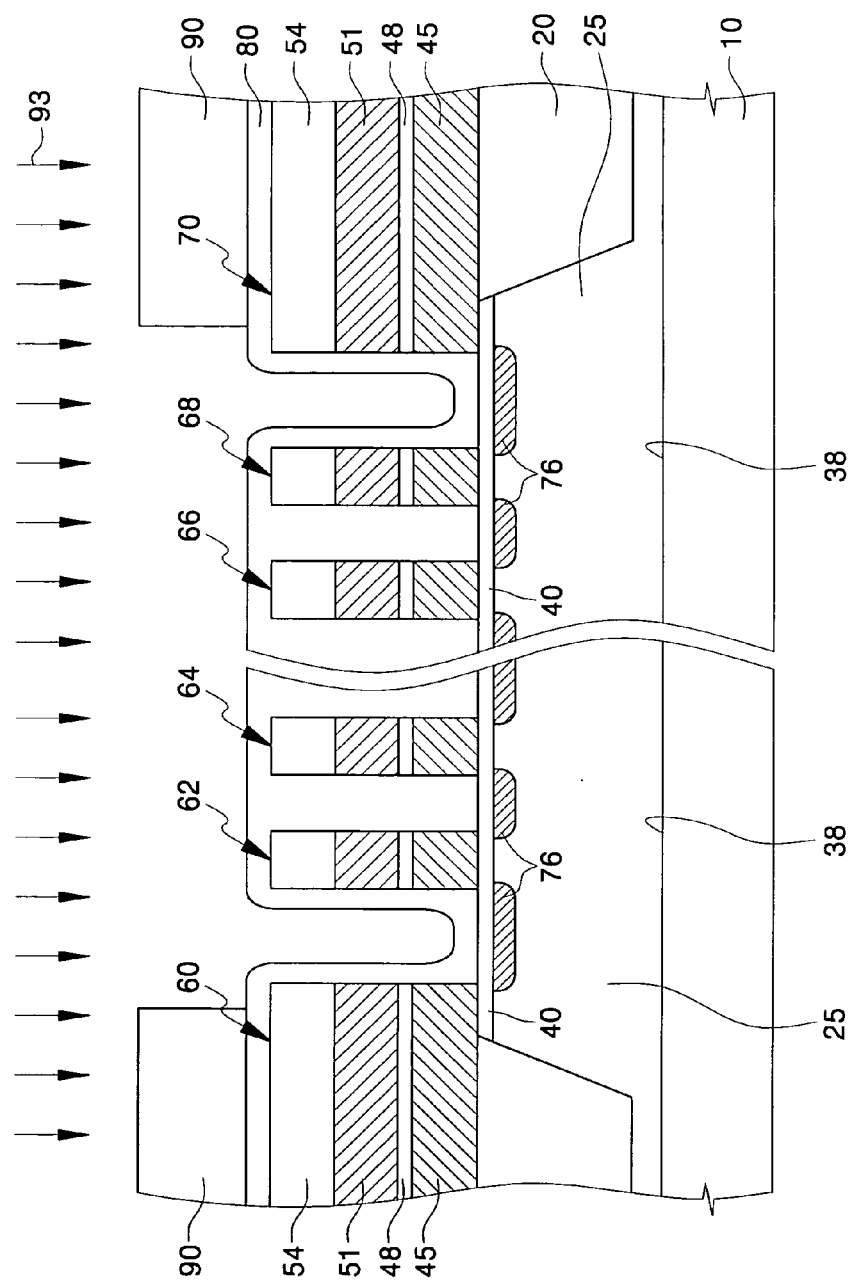

Referring now to FIGS. 1, 10 and 11, the ion implantation process 73 forms lower concentration impurity diffusion layers 76 in the semiconductor substrate 10. The lower concentration impurity diffusion layers 76 overlap with first to fourth cell gate patterns 62, 64, 66, and 68 and first and second select gate patterns 60 and 70. The lower concentration impurity diffusion layers 76 may be formed of impurity ions of a different conductivity type than the semiconductor substrate 10. For example, the lower concentration impurity diffusion layers 76 may be formed of N type impurity ions. The lower concentration impurity diffusion layers 76 may correspond to source/drain regions.

As shown in FIG. 10, a spacer insulating layer 80 is formed to conformably cover the first to fourth cell gate patterns 62, 64, 66, and 68, and the first and second select gate patterns 60 and 70. The spacer insulating layer 80 may be formed to a predetermined thickness (T) that is greater than one half of the distance (W) between each of the first to fourth cell gate patterns 62, 64, 66, and 68. Photoresist patterns 90 are formed on the spacer insulating layer 80 to cover portions of top surfaces of the first and second select gate patterns 60 and 70. An etching process 93 is then performed on the spacer insulating layer 80 using the photoresist patterns 90 as an etching mask.

Figure 12:
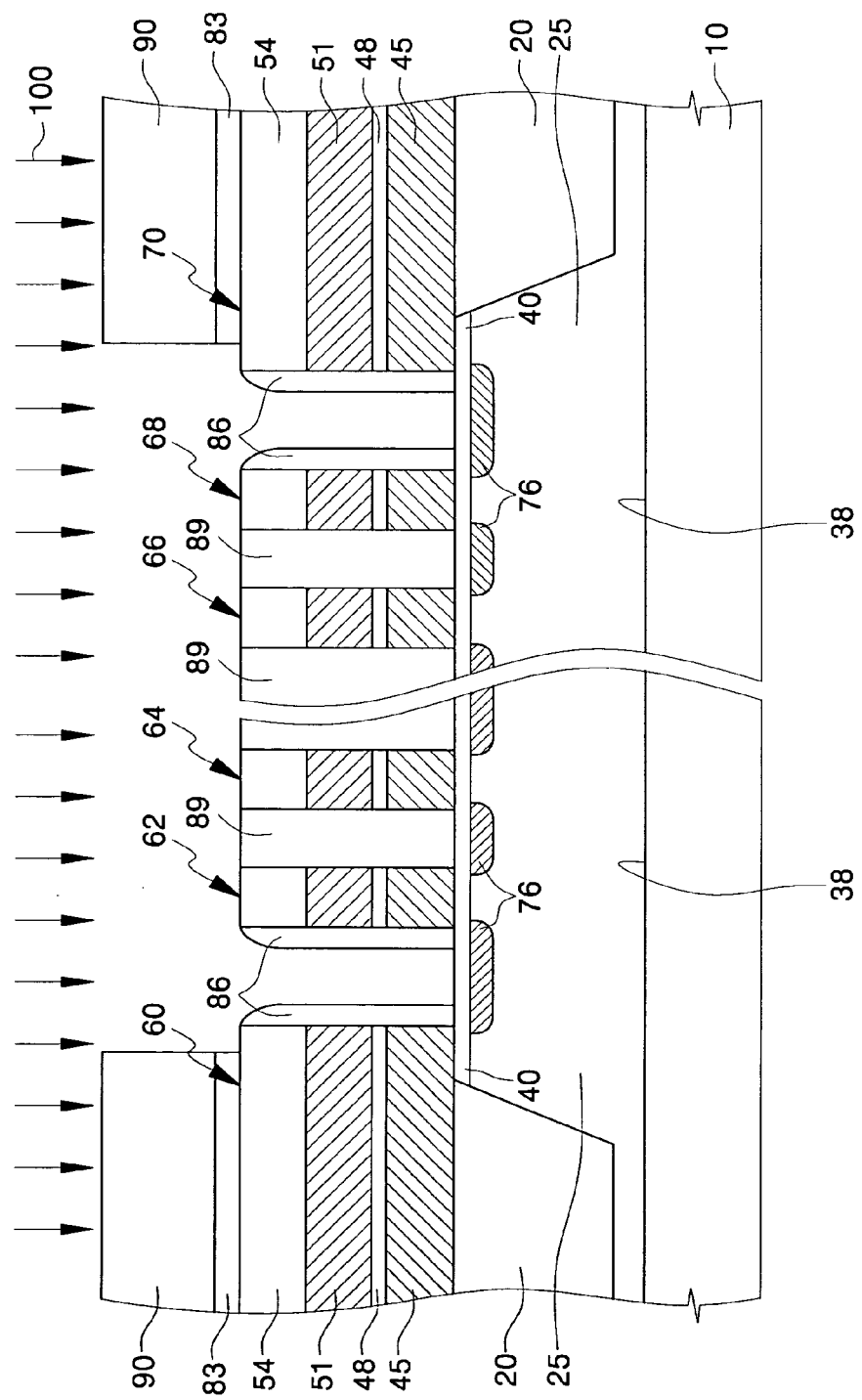
Figure 13:
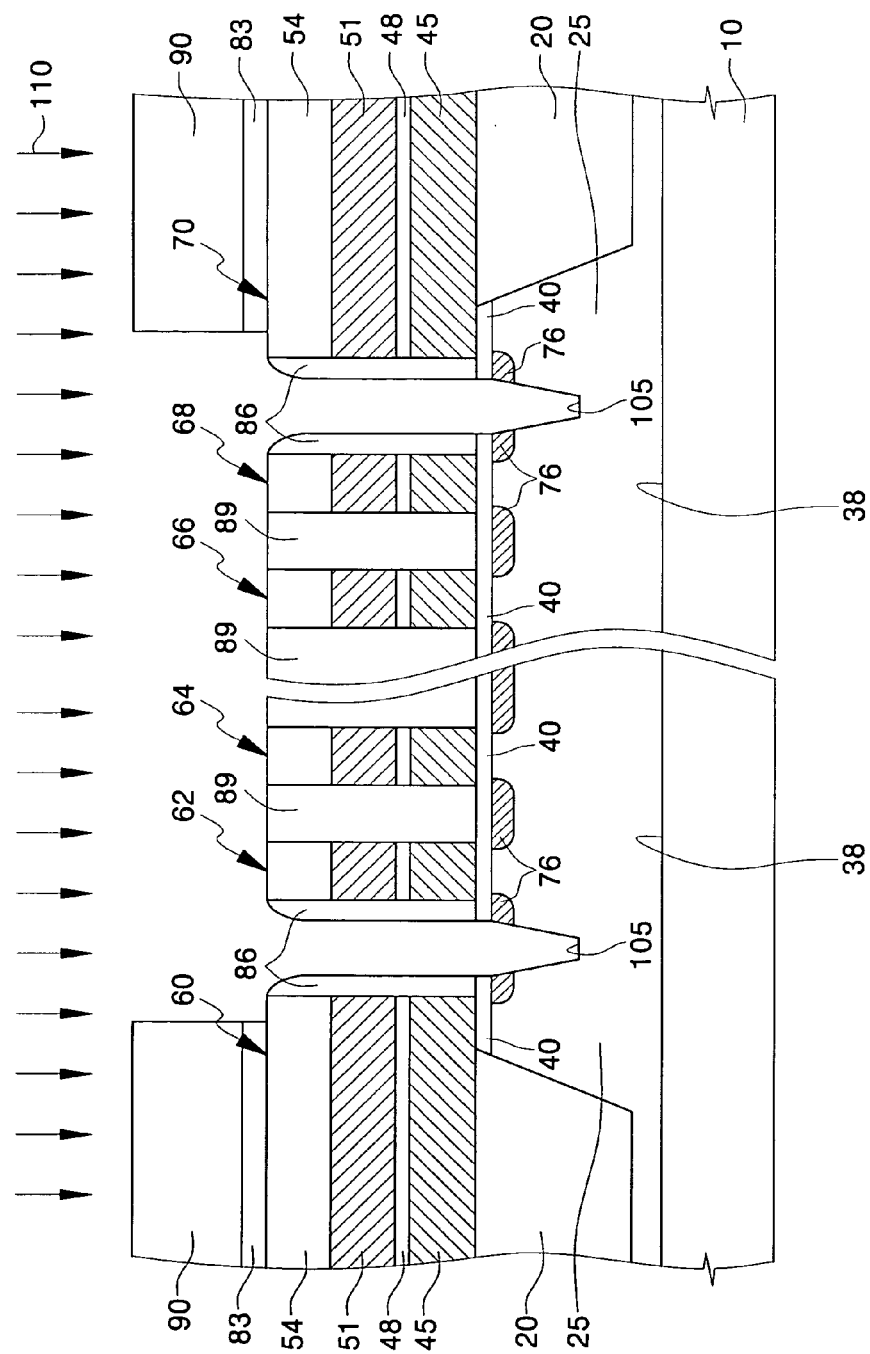

Referring to FIGS. 1, 12 and 13, the etching process 93 forms spacer isolation patterns 89, spacer sidewall patterns 86 and spacer layer patterns 83 on the semiconductor substrate 10. The etching process 93 is performed to expose the active region 25 of semiconductor substrate 10 between the first select gate pattern 60 and the first cell gate pattern 62, and between the second select gate pattern 70 and the fourth cell gate pattern 68. As shown in FIG. 12, the spacer isolation patterns 89 fill regions between the first to fourth cell gate patterns 62, 64, 66, and 68. The spacer sidewall patterns 86 cover sidewalls of the first cell gate pattern 62 and the first select gate pattern 60, and cover sidewalls of the fourth cell gate pattern 68 and the second select gate pattern 70. The spacer layer patterns 83 are formed beneath the photoresist patterns 90 to cover other sidewalls and top surfaces of the first and second select gate patterns 60 and 70.

An etching process 100 is then performed on the exposed gate insulating layer 40 and active region 25 of the semiconductor substrate 10 using the first and second select gate patterns 60 and 70, the first to fourth cell gate patterns 62, 64, 66, and 68, the spacer sidewall patterns 86, the spacer isolation patterns 89, the spacer layer patterns 83, and the photoresist patterns 90 as an etching mask. The etching process 100 is performed to penetrate the gate insulating layer 40 and form space trenches 105 in the active region 25 of the semiconductor substrate 10 as illustrated in FIG. 13. The space trenches 105 are formed between the first cell gate pattern 62 and the first select gate pattern 60, and between the fourth cell gate pattern 68 and the second select gate pattern 70, thereby dividing respective impurity diffusion layers 76 into split source/drain regions. Accordingly, the space trenches 105 are aligned with the spacer sidewall patterns 86. Each of the space trenches 105 may be formed to a predetermined depth that is greater than a thickness of each of the spacer sidewall patterns 86. Each of the space trenches 105 may be formed to include opposing sidewalls and a bottom surface. The bottom surfaces of the space trenches 105 may be formed to have step differences with the surface of the semiconductor substrate 10 beneath the first to fourth cell gate patterns 62, 64, 66, and 68 and/or the surface of the substrate 10 beneath the first and second select gate patterns 60 and 70. The sidewalls of the space trenches 105 may be inclined at an angle that is different from an angle between the spacer sidewall patterns 86 and the surface of the semiconductor substrate 10. Further, the distance between the upper sidewalls of the space trenches 105 may be smaller than the distance between the first cell gate pattern 62 and the first select gate pattern 60 and/or the distance between the fourth cell gate pattern 68 and the second select gate pattern 70.

An ion implantation process 110 is then performed on the semiconductor substrate 10 using the first to fourth cell gate patterns 62, 64, 66, and 68, the first and second select gate patterns 60 and 70, the spacer isolation patterns 89, the spacer sidewall patterns 86, the spacer layer patterns 83, and the photoresist patterns 90 as an ion mask.

Figure 14:
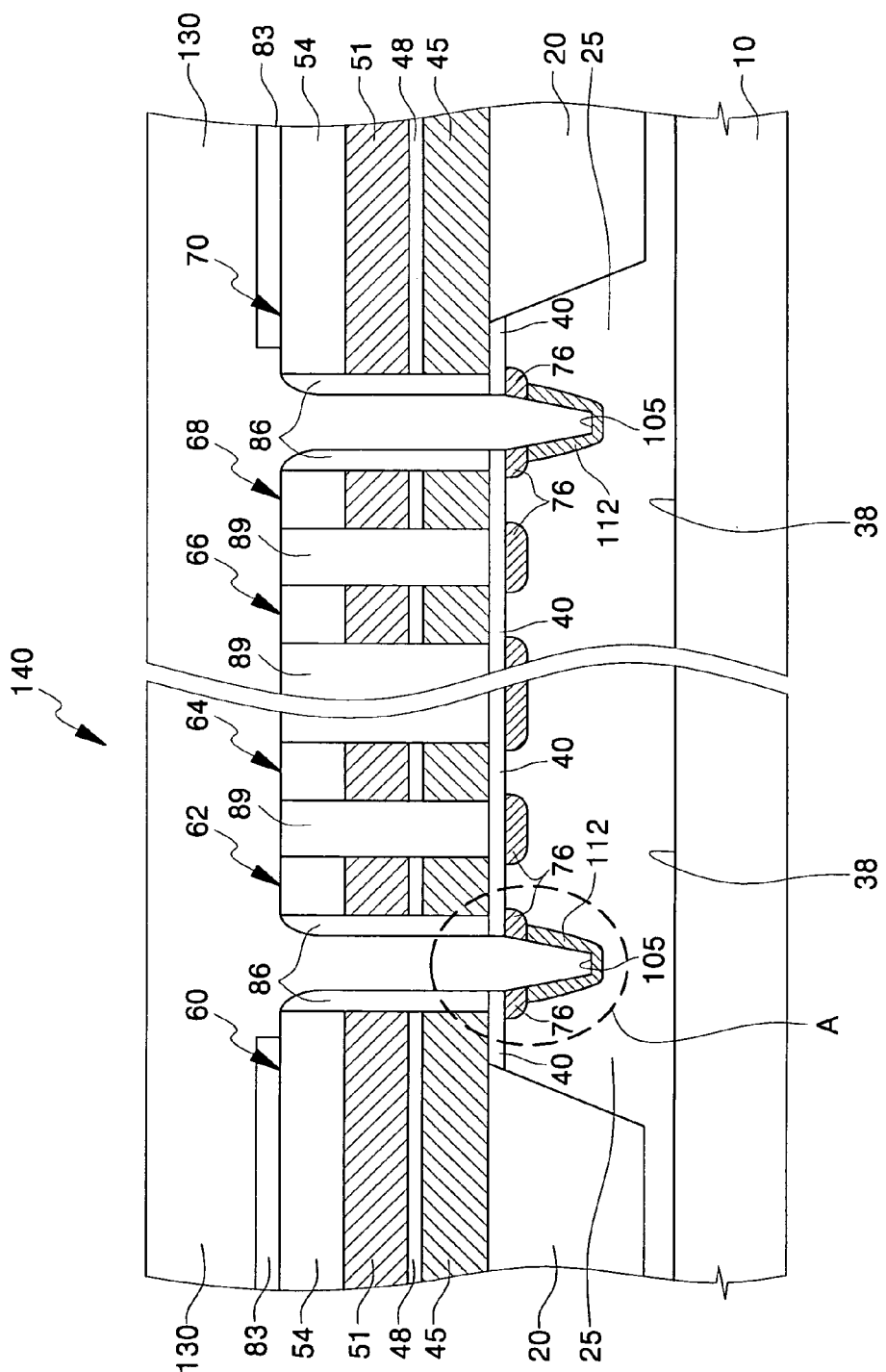

Referring now to FIGS. 1 and 14, the ion implantation process 110 forms higher concentration impurity diffusion layers 112 in the semiconductor substrate 10. The higher concentration impurity diffusion layers 112 are respectively formed along the sidewalls and bottom surfaces of the space trenches 105 between the first cell gate pattern 62 and the first select gate pattern 60 and between the fourth cell gate pattern 68 and the second select gate pattern 70. The higher concentration impurity diffusion layers 112 thereby form connecting regions in the substrate 10 that extend around the trenches 105 beneath lower concentration impurity diffusion layers 76. The lower and higher concentration impurity diffusion layers 76 and 112 may be formed to have the same conductivity type. As such, the first and fourth cell gate patterns 62 and 68 may form cell transistors 72 as shown in FIG. 1, where the lower and higher concentration impurity regions 76 and 112 form respective source/drain regions. Similarly, the first and second select gate patterns 60 and 70 may form select transistors 71 as shown in FIG. 1, where the lower and higher concentration impurity regions 76 and 112 form respective source/drain regions. The lower concentration impurity diffusion layers 76 are divided by the space trenches 105 between the first cell gate pattern 62 and the first select gate pattern 60 and between the fourth cell gate pattern 68 and the second select gate pattern 70 to form split source/drain regions having spaced apart source/drain subregions. In some embodiments, the ion implantation process 110 may not be performed, and other techniques for connecting the split source/drain regions may be employed.

Still referring to FIG. 14, after the higher concentration impurity diffusion layers 112 are formed, the photoresist patterns 90 are removed from the semiconductor substrate 10. A planarization interlayer insulating layer 130 is formed to fill the space trenches 105 between the first cell gate pattern 62 and the first select gate pattern 60, and between the fourth cell gate pattern 68 and the second select gate pattern 70. The planarization interlayer insulating layer 130 also covers the spacer layer patterns 83. Accordingly, a non-volatile memory device 140 is formed including storage cell and select transistors 72 and 71. The non-volatile memory device 140 may be formed to have a NAND type structure.

Referring now to FIGS. 1, 15 and 16, the higher concentration impurity diffusion layers 112 connect the spaced-apart lower concentration impurity diffusion layers 76 and are formed along sidewalls and the bottom surface of the space trenches 105. The higher concentration impurity diffusion layers 112 may be formed conformably by using sidewalls of the space trenches 105 without tilting an ion beam gun during the ion implantation process 110 of FIG. 13. Accordingly, deterioration of the gate insulating layer 40 due to hot electron injection may be reduced, as the lower and higher concentration impurity diffusion layers 76 and 112 form a lightly doped drain (LDD) structure in the semiconductor substrate 10 for the cell and select transistors 72 and 71.

As illustrated in FIG. 15, the movement of the hot electrons may be determined based on the voltages applied to the first cell and first select gate patterns 62 and 60. When the voltage applied to the first cell gate pattern 62 is higher than that applied to the first select gate pattern 60, hot electrons may be injected into the gate insulating layer 40 through the semiconductor substrate 10 beneath the first cell gate pattern 62 through the lower and higher concentration impurity diffusion layers 76 and 112 overlapping the first cell gate pattern 62. Election flow from the higher concentration impurity diffusion layer 112 to the lower concentration impurity diffusion layer 76 along the sidewalls of the trenches 105 may result in a reduced electric field intensity as compared to the case where no space trenches 105 are used.

More particularly, when hot electrons injected along arrow 114 arrive at an overlapping region of the lower and higher concentration impurity diffusion layers 76 and 112 and travel along arrow 116 to the lower concentration impurity diffusion layers 76, the electric field intensity is reduced due to the reduced doping gradient provided by the LDD structure. Accordingly, the hot electrons injected into the lower concentration impurity diffusion layers 76 adjacent to the cell gate pattern 62 may travel along arrow 118 directed upward to the semiconductor substrate 10 with less energy as compared to the case of not passing through the space trench 105 and the LDD structure. Thus, hot electron injection into the gate insulating layer 40 of the first cell gate pattern 62 may be reduced. As such, the deterioration of the gate insulating layer 40 may also be reduced, and the electrical properties of the cell transistor 71 may be maintained.

FIG. 16 is a graph illustrating the electrical properties of three non-volatile memory devices 143, 146 and 149. Each of the non-volatile memory devices 143, 146 and 149 includes a plurality of active regions 25. Each of the active regions 25 includes first to fourth cell gate patterns 62, 64, 66, and 68, and first and second select gate patterns 60 and 70. The first to fourth cell gate patterns 62, 64, 66, and 68 are formed with the same distances therebetween. Each of the non-volatile memory devices 143, 146, and 149 are illustrated in FIG. 16 based on the different distances (85, 105, and 115 nm, respectively) between their respective first cell and first select gate patterns 62 and 60, and fourth cell and the second select gate patterns 68 and 70.

In addition, each of the non-volatile memory devices 143, 146 and 149 was driven by applying a different voltage to the first and second select gate patterns 60 and 70 than the voltage applied to the first to fourth cell gate patterns 62, 64, 66, and 68. Each of the non-volatile memory devices 143, 146 and 149 may have at least one cell transistor that has failed, depending on the distance between the first cell gate pattern 62 and the first select gate pattern 60 and/or the distance between the fourth cell gate pattern 68 and the second select gate pattern 70 when data read and write operations are repeatedly performed. The cell transistor failure is related to a cell voltage that may deteriorate the gate insulating layer. FIG. 16 shows a correlation between the cell voltage and the distance between the first cell gate pattern 62 and the first select gate pattern 60 and/or the distance between the fourth cell gate pattern 68 and the second select gate pattern 70.

FIG. 16 illustrates that the greater the distance between the first cell gate pattern 62 and the first select gate pattern 60, the greater the cell voltage. This means that the electric field intensity, which is affected by the lower and higher concentration impurity diffusion layers, is reduced as the distance between the first cell gate pattern 62 and the first select gate pattern 60 increases. Accordingly, it may be less likely that hot electrons are injected into the gate insulating layer 40 beneath the first cell gate pattern 62 as the distance between the first cell gate pattern 62 and the first select gate pattern 60 increases. Therefore, to compensate for the reduced distance between cell and select gate patterns as devices are scaled-down, the non-volatile memory devices 143, 146 and 149 include space trenches 105 formed in the semiconductor substrate 10 between the first cell gate pattern 62 and the first select gate pattern 60 and between the fourth cell gate pattern 68 and the second select gate pattern 70.

FIGS. 17 to 20 are cross-sectional views illustrating methods of forming non-volatile memory devices according to further embodiments of the present invention taken along the line I–I' of FIG. 1. In FIGS. 17 to 20, like reference numerals refer to similar components as described with reference to FIGS. 4 to 10. Accordingly, discussion of the methods illustrated in FIGS. 17 to 20 will begin after the formation of the spacer insulating layer 80 of FIG. 10.

Figure 17:
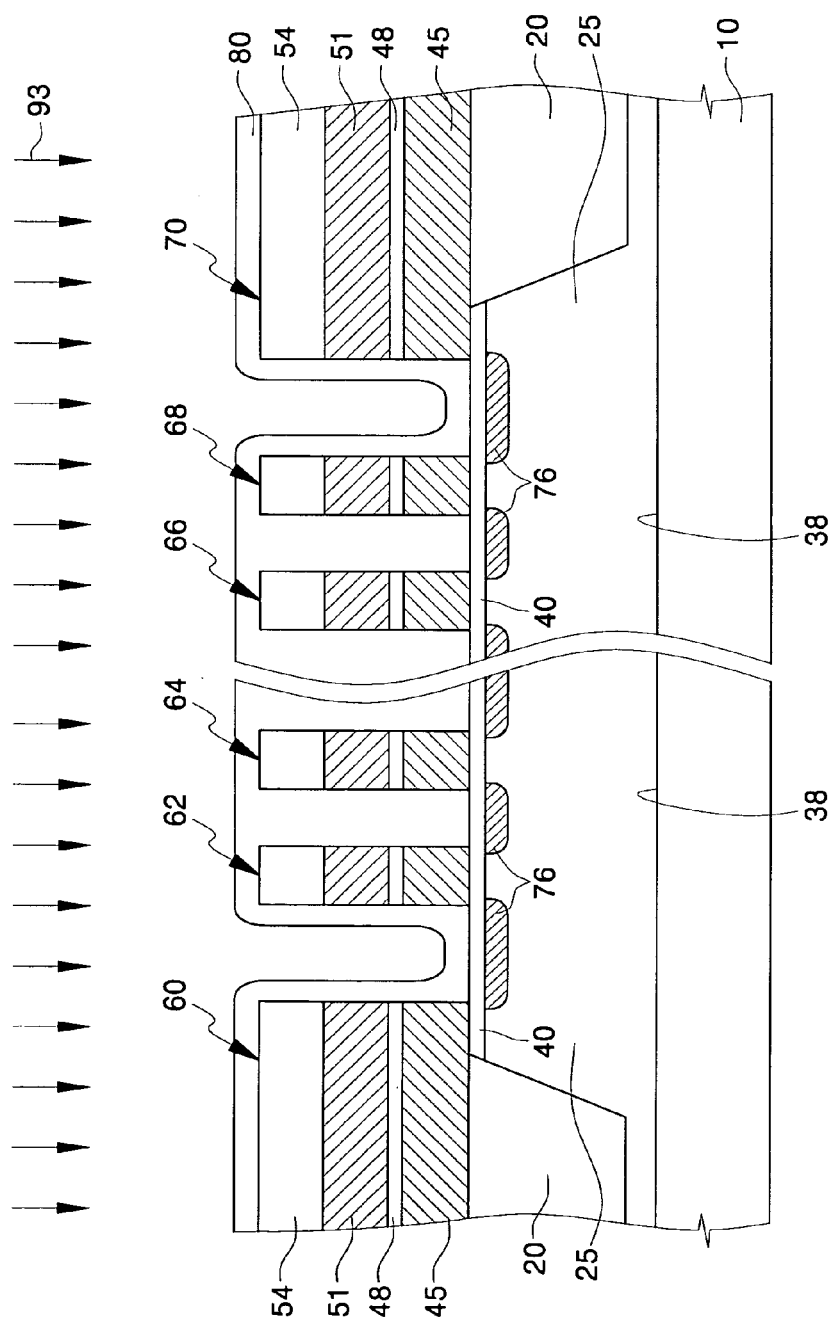
FIGS. 17 to 20 are cross-sectional views illustrating methods of forming a non-volatile memory device according to further embodiments of the present invention taken along line I–I' of FIG. 1.
Figure 18:
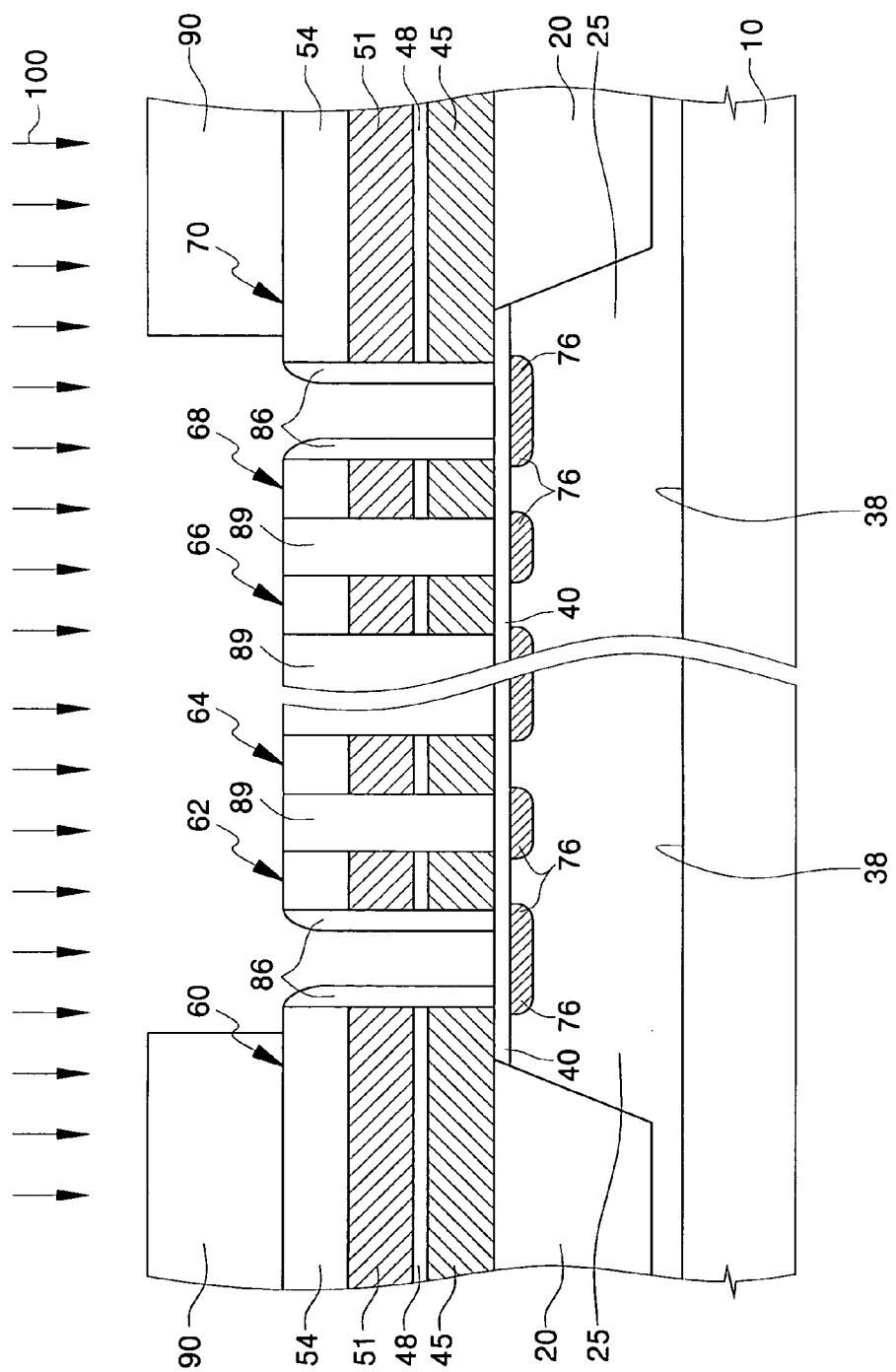

Referring now to FIGS. 1, 17 and 18, an etching process 93 is performed on the spacer insulating layer 80. The etching process 93 forms spacer isolation patterns 89 and spacer sidewall patterns 86 on the semiconductor substrate 10. The etching process 93 also exposes the active region 25 of the semiconductor substrate 10.

The spacer isolation patterns 89 fill regions between first to fourth cell gate patterns 62, 64, 66, and 68. The spacer sidewall patterns 86 are formed to cover sidewalls of first cell gate pattern 62 and the first select gate pattern 60 and the fourth cell gate pattern 68 and the second select gate pattern 70, and as well as other sidewalls of the first and second select gate patterns 60 and 70.

As shown in FIG. 18, photoresist patterns 90 are formed to cover portions of the first and second select gate patterns 60 and 70. An etching process 100 is performed on the gate insulating layer 40 and the active region 25 of the semiconductor substrate 10 using the first to fourth cell gate patterns 62, 64, 66, and 68, the first and second select gate patterns 60 and 70, the spacer sidewall patterns 86, the spacer isolation patterns 89, and the photoresist patterns 90 as an etch mask.

Figure 19:
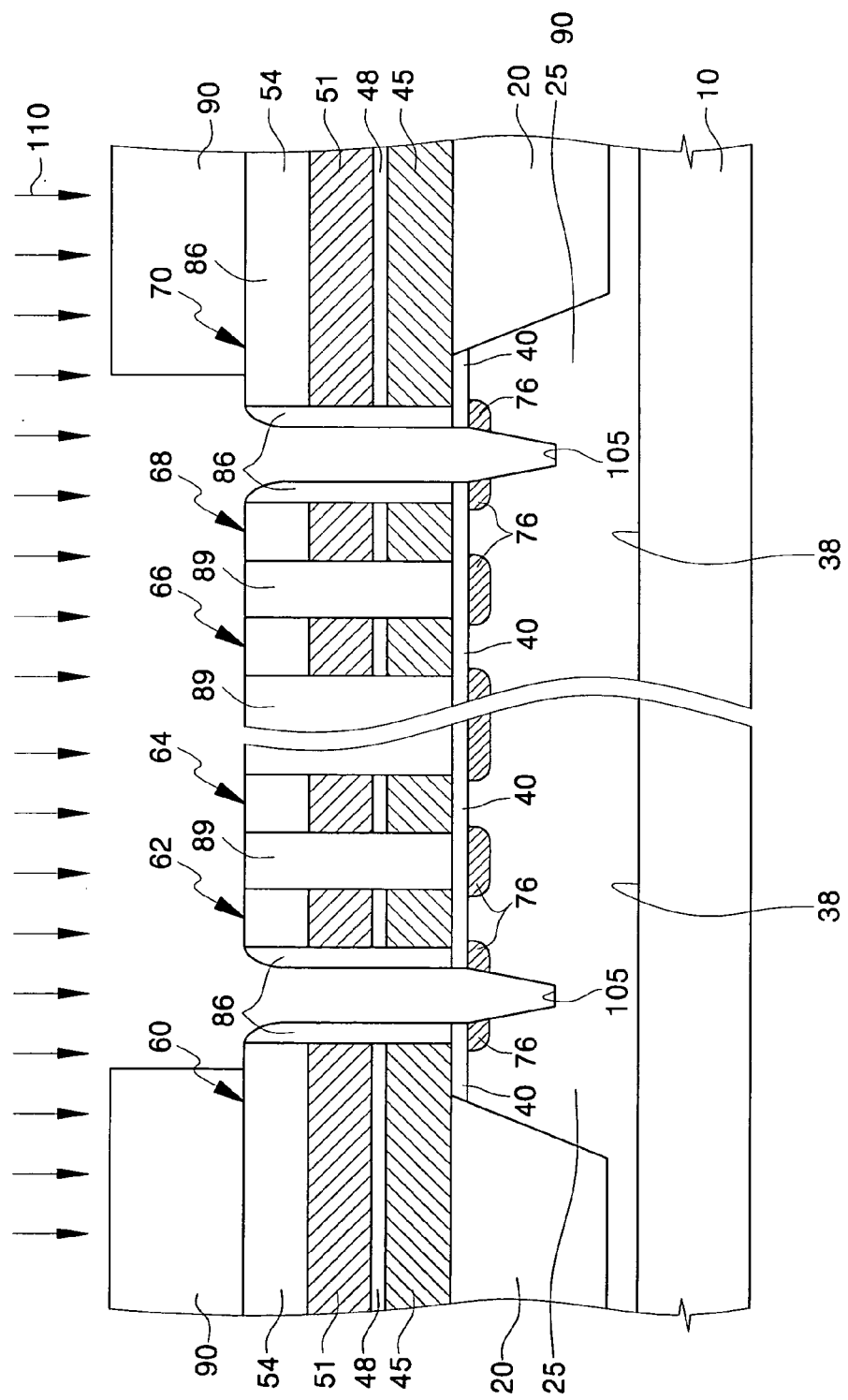
Figure 20:
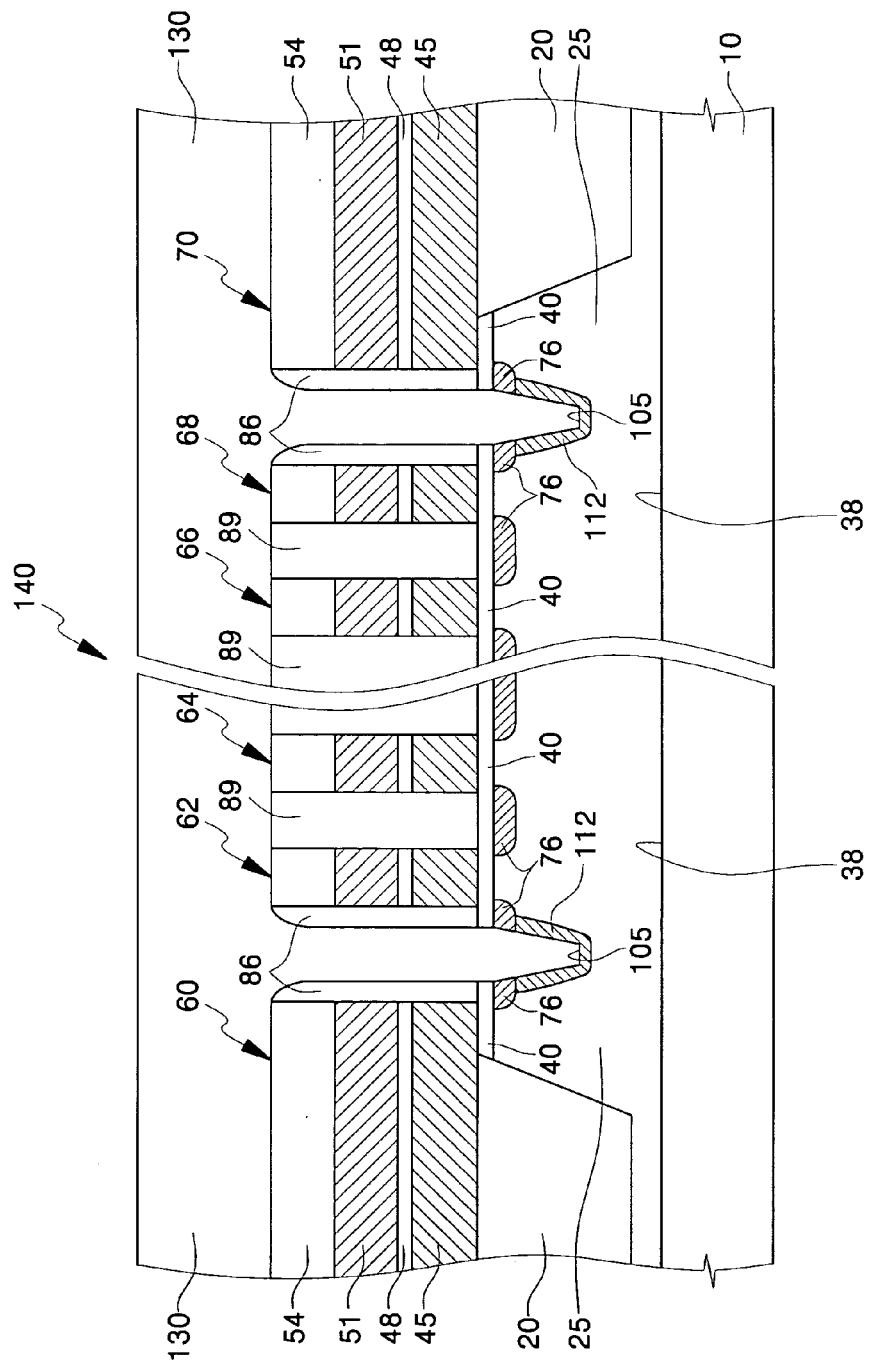

Referring now to FIGS. 1, 19 and 20, the etching process 100 forms space trenches 105 in the active region 25 of the semiconductor substrate 10 by penetrating the gate insulating layer 40 between the first cell gate pattern 62 and the first select gate pattern 60 and between the fourth cell gate pattern 68 and the second select gate pattern 70. Accordingly, the space trenches 105 are aligned with spacer sidewall patterns 86. Each of the space trenches 105 may be formed to a predetermined depth greater than the thickness of each of the spacer sidewall patterns 86. Each of the space trenches 105 may include opposing sidewalls and a bottom surface. The bottom surfaces of the space trenches 105 are formed to have step differences with the surface of the semiconductor substrate 10 beneath the first to fourth cell gate patterns 62, 64, 66, and 68 and/or the surface of the substrate 10 beneath the first and second select gate patterns 60 and 70. The sidewalls of the space trenches 105 may be inclined at an angle that is different from an angle between the spacer sidewall patterns 86 and the surface of the semiconductor substrate 10. The distance between upper portions of the space trenches 105 may be smaller than the distance between the first cell gate pattern 62 and the first select gate pattern 60 and/or the distance between the fourth cell gate pattern 68 and the second select gate pattern 70.

An ion implantation process 110 is then performed on the semiconductor 10 using the first to fourth cell gate patterns 62, 64, 66, and 68, the first and second select gate patterns 60 and 70, the spacer isolation patterns 89, the spacer sidewall patterns 86, and the photoresist patterns 90 as an ion mask. The ion implantation process 110 forms high concentration impurity diffusion layers 112 in the semiconductor substrate 10 beneath the lower concentration impurity diffusion layers 76 along sidewalls and bottom surfaces of the space trenches 105 between the first cell gate pattern 62 and the first select gate pattern 60 and between the fourth cell gate pattern 68 and the second select gate pattern 70. The low and high concentration impurity diffusion layers 76 and 112 may be formed to have the same conductivity type. The low concentration impurity diffusion layers 76 are divided by the space trenches 105 between the first cell gate pattern 62 and the first select gate pattern 60 and between the fourth cell gate pattern 68 and the second select gate pattern 70 to form split source/drain regions having spaced apart source/drain subregions. In some embodiments, the ion implantation process 110 may not be performed, and other techniques for connecting the split source/drain regions may be employed.

After the high concentration impurity diffusion layers 112 are formed, the photoresist patterns 90 are removed from the semiconductor substrate 10. A planarization interlayer insulating layer 130 is then formed to fill the space trenches 105 and the regions between the first cell gate pattern 62 and the first select gate pattern 60, and between the fourth cell gate pattern 68 and the second select gate pattern 70, as illustrated in FIG. 20.

As such, a non-volatile memory device 140 is formed including cell and select transistors 71 and 71 as shown in FIG. 2. The non-volatile memory device 140 may be formed to have a NAND type structure. Thus, the space trenches 105 can provide a non-volatile memory device 140 having electrical properties as illustrated in FIG. 16. In other words, the trenches 105 may compensate for the reduced distance between storage cell gate electrodes and select gate electrodes by reducing the electric field intensity.

As described above, some embodiments of the present invention may provide non-volatile memory devices and methods of forming the same which may reduce problems associated with device scale-down by providing trenches between the cell gate patterns and the select gate patterns. Thus, the electrical properties of the cell transistors may be improved.

While the present invention has been particularly shown and described with reference to embodiments thereof, it will be understood by those skilled in the art that various changes in form and details may be made therein without departing from the spirit and scope of the invention as defined by the appended claims and their equivalents.

The invention claimed is:

1. A NAND-type semiconductor flash memory device, comprising:
a semiconductor substrate including a trench therein;
first and second gate patterns on a surface of the substrate adjacent the trench, a respective one of which is on a respective opposing side of the trench;
a split source/drain region in the substrate between the first gate pattern and the second gate pattern and divided by the trench, the split source/drain region including a first source/drain subregion between the first gate pattern and the trench and a second source/drain subregion between the second gate pattern and the trench;
a connecting region in the substrate that extends around the trench from the first source/drain subregion to the second source/drain subregion;
a third gate pattern on the surface of the substrate adjacent the second gate pattern, wherein the surface of the substrate that extends between the second gate pattern and the third gate pattern is substantially planar; and, a continuous source drain region in the substrate between the second gate pattern and the third gate pattern,
wherein the first gate pattern comprises a select gate pattern, and wherein the second gate pattern comprises a storage gate pattern.

2. The device of claim 1, wherein the connecting region and the split source/drain region comprise a same conductivity type.

3. The device of claim 2, wherein the connecting region has a higher carrier concentration than that of the split source/drain region.

4. The device of claim 2, wherein the trench includes opposing sidewalls and a lower surface remote from the surface of the substrate, wherein a respective first and second source/drain subregion is adjacent a respective sidewall at the substrate surface, and wherein the connecting region extends from the first and second source/drain subregions along the sidewalls and around the lower surface.

5. The device of claim 4, wherein the sidewalls of the trench are oblique relative to the substrate surface.

6. The device of claim 1, further comprising:
spacers on sidewalls of the first and second gate patterns and facing one another, wherein the spacers are aligned with the trench.

7. The device of claim 1, further comprising:
an insulating layer between the first and second gate patterns that fills the trench.

8. The device of claim 1, wherein each of the first and second gate patterns comprises a gate insulating layer pattern, a floating gate pattern, and a control gate pattern.

9. The device of claim 1, wherein the connecting region and the split source/drain region comprise n-type regions.

10. A NAND type non-volatile semiconductor memory device, comprising:
first and second select gate patterns on a surface of a semiconductor substrate; and
a plurality of storage gate patterns on the surface of the substrate between the first and second select gate patterns,
wherein the substrate includes a first trench therein between the first select gate pattern and a first one of the plurality of storage gate patterns that is adjacent thereto, and wherein the substrate further includes a second trench therein between the second select gate pattern and a second one of the plurality of storage gate patterns that is adjacent thereto, and wherein the surface of the substrate that extends between the plurality of storage gate patterns is substantially planar.

11. The device of claim 10, further comprising:
a first split source/drain region in the substrate between the first select gate pattern and the first one of the plurality of storage gate patterns and split by the first trench; and
a second split source/drain region in the substrate between the second select gate pattern and the second one of the plurality of storage gate patterns and split by the second trench; and
a plurality of continuous source/drain regions in the substrate between respective pairs of the plurality of storage gate patterns.

12. The device of claim 11, wherein the first split source/drain region comprises a first source/drain subregion between the first select gate pattern and the first trench and a second source/drain subregion between the first trench and the first one of the plurality of storage gate patterns and spaced apart from the first source/drain subregion, and wherein the second split source/drain region comprises a third source/drain subregion between the second select gate pattern and the second trench and a fourth source/drain subregion between the second trench and the second one of the plurality of storage gate patterns and spaced apart from the third source/drain subregion.

13. The device of claim 12, further comprising:
a first connecting region in the substrate that extends around the first trench from the first source/drain subregion to the second source/drain subregion; and
a second connecting region in the substrate that extends around the second trench from the third source/drain subregion to the fourth source/drain subregion.

14. The device of claim 13, wherein the first and second connecting regions and the first and second split source/drain regions comprise a same conductivity type.

15. The device of claim 14, wherein the first and second connecting regions have higher carrier concentrations than carrier concentrations of the first and second split source/drain regions.

16. The device of claim 13, wherein the first and second trenches respectively include opposing sidewalls and a lower surface remote from the surface of the substrate, wherein a respective first and second source/drain subregion is directly adjacent a respective sidewall of the first trench, wherein a respective third and fourth source/drain subregion is adjacent a respective sidewall of the second trench, arid wherein the first and second connecting regions respectively extend along the sidewalls and around the lower surface of the respective first and second wenches.

17. The device of claim 16, wherein the sidewalls of the trench are oblique relative to the substrate surface.

18. The device of claim 10, wherein each of the select and storage gate patterns comprises a gate insulating layer pattern, a floating gate pattern, and a control gate pattern.

19. The device of claim 10, wherein a distance between storage gate patterns is less than a distance between the first select gate pattern and the first one of the plurality of storage gate patterns that is adjacent thereto.

20. A non-volatile memory device comprising:
a plurality of cell gate patterns spaces apart from each other on an active region of a semiconductor substrate, and
first and second select gate patterns adjacent to first and second cell gate patterns on outermost sides of the plurality of cell gate patterns on the semiconductor substrate, the first select gate pattern being placed opposite to the second cell gate pattern and in parallel with the first cell gate pattern, and the second select gate pattern being placed opposite to the first cell gate pattern and in parallel with the second cell gate pattern,
wherein surfaces of the semiconductor substrate beneath the plurality of cell gate patterns have step differences with surfaces of the semiconductor substrate between the first cell gate pattern and the first select gate pattern and between the second cell gate pattern and the second select gate pattern.

21. The device according to claim 20, further comprising:
at least one space trench placed in the active region of the semiconductor substrate between the first cell gate pattern and the first select gate pattern and between the second cell gate pattern and the second select gate pattern; and
spacer sidewall patterns covering sidewalls of the first cell gate pattern and the first select gate pattern and of the second cell gate pattern and the second select gate pattern.

22. The device according to claim 21, wherein the space trenches are aligned with the spacer sidewall patterns.

23. The device according to claim 21, wherein each of the space trenches has a depth larger than that of a thickness of each of the spacer sidewall patterns.

24. The device according to claim 21, wherein the space trenches include sidewalls having an inclined angle different from an angle between the spacer sidewall patterns and the top surface of the semiconductor substrate.

25. A non-volatile memory device comprising:
an active region having first and second regions in a semiconductor substrate;
a select gate pattern and a first cell gate pattern placed on the first and second regions, respectively;
a gate insulating layer between the select gate pattern and the first region and between the first cell gate pattern and the second region;
an impurity diffusion layer in the semiconductor substrate under the gate insulating layer, the impurity diffusion layer overlapping the first cell gate pattern; and
a space trench placed in the semiconductor substrate between the first and second regions; and
a second cell gate pattern placed on the second region adjacent the first cell gate pattern,
wherein the first and second regions are coplanar, and wherein the second region is substantially planar.

26. The device according to claim 25, wherein the space trench has sidewalls having an inclined slope.

27. The device according to claim 25, further comprising spacer sidewall patterns covering sidewalls of the cell gate pattern and the select gate pattern,
wherein the spacer sidewall patterns are aligned with the space trench.

28. The device according to claim 27, wherein the space trench has a predetermined depth greater than a thickness of each spacer sidewall patterns.

29. A non-volatile memory device, comprising:
two recess regions formed in an active region of a semiconductor substrate and spaced at a predetermined interval, each of the recess regions having respective left and right sidewalls that face each other;
at least two cell gate patterns on the active region of the semiconductor substrate between the right sidewall of a first one of the recess regions and the left sidewall of a second one of the recess regions, wherein the active region of the semiconductor substrate between the at least two cell gate patterns is substantially planar; and
first and second select gate patterns on the active region of the semiconductor substrate, the first select gate pattern being adjacent to the left sidewall of the first one of the recess regions, and the second select gate pattern being adjacent to the right sidewall of the second one of the recess regions.

30. The device according to claim 29, further comprising:
first impurity diffusion layers formed in the semiconductor substrate between the cell gate patterns; and
second impurity diffusion layers formed along the semiconductor substrate defining the recess regions,
wherein the second impurity diffusion layers are formed beneath the first impurity diffusion layers.

31. The device according to claim 30, wherein the second impurity diffusion layers have a carrier concentration greater than a carrier concentration of the first impurity diffusion layers.

* * * * *